(12) United States Patent
Bao et al.

(10) Patent No.: US 9,431,346 B2
(45) Date of Patent: Aug. 30, 2016

(54) GRAPHENE-METAL E-FUSE

(71) Applicant: GLOBALFOUNDRIES INC., Grand Cayman (KY)

(72) Inventors: Junjing Bao, San Diego, CA (US); Griselda Bonilla, Fishkill, NY (US); Samuel S. Choi, Hopewell Junction, NY (US); Ronald G. Filippi, Wappingers Falls, NY (US); Andrew T. Kim, Poughkeepsie, NY (US); Naftali E. Lustig, Croton on Hudson, NY (US); Andrew H. Simon, Fishkill, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 28 days.

(21) Appl. No.: 14/454,765

(22) Filed: Aug. 8, 2014

(65) Prior Publication Data

US 2014/0346674 A1 Nov. 27, 2014

Related U.S. Application Data

(63) Continuation-in-part of application No. 13/873,356, filed on Apr. 30, 2013, now Pat. No. 9,257,391.

(51) Int. Cl.
*H01L 21/47* (2006.01)
*H01L 21/44* (2006.01)
(Continued)

(52) U.S. Cl.
CPC ..... *H01L 23/53276* (2013.01); *H01L 23/5256* (2013.01); *B82Y 30/00* (2013.01);
(Continued)

(58) Field of Classification Search
CPC ..... H01L 23/48; H01L 21/768; H01L 21/44; H01L 23/53; H01L 21/00
USPC .......... 438/618–651; 257/770–774, E21.575, 257/E51.038–E51.039, E51.04; 977/734
See application file for complete search history.

(56) References Cited

U.S. PATENT DOCUMENTS

| 5,470,788 A | 11/1995 | Biery et al. |
| 6,597,067 B1 | 7/2003 | Biery et al. |

(Continued)

FOREIGN PATENT DOCUMENTS

| CN | 102593098 A | 7/2012 |
| JP | 2009267371 A | 11/2009 |

(Continued)

OTHER PUBLICATIONS

Chen et al., "Intrinsic and Extrinsic Performance Limits of Graphene Devices on SiO2", Materials Research Science and Engineering Center, Center for Nanophysics and Advanced Materials, Department of Physics, University of Maryland.

(Continued)

*Primary Examiner* — Julio J Maldonado
*Assistant Examiner* — Sheikh Maruf
(74) *Attorney, Agent, or Firm* — Hoffman Warnick LLC; Yuanmin Cai

(57) ABSTRACT

A structure including an $M_x$ level including a first $M_x$ metal, a second $M_x$ metal, and a third $M_x$ metal abutting and electrically connected in sequence with one another, the second $M_x$ metal including graphene, and an $M_{x+1}$ level above the $M_x$ level, the $M_{x+1}$ level including an $M_{x+1}$ metal and a via, the via electrically connects the third $M_x$ metal to the $M_{x+1}$ metal in a vertical orientation.

13 Claims, 22 Drawing Sheets

(51) Int. Cl.
*H01L 23/532* (2006.01)
*H01L 23/525* (2006.01)
*B82Y 40/00* (2011.01)
*B82Y 30/00* (2011.01)

(52) U.S. Cl.
CPC ......... *B82Y 40/00* (2013.01); *H01L 23/53223* (2013.01); *H01L 23/53238* (2013.01); *H01L 23/53252* (2013.01); *H01L 23/53266* (2013.01); *H01L 2924/0002* (2013.01); *Y10S 977/794* (2013.01); *Y10S 977/842* (2013.01); *Y10S 977/932* (2013.01)

(56) References Cited

U.S. PATENT DOCUMENTS

| | | |
|---|---|---|
| 7,259,463 B2 | 8/2007 | Huang et al. |
| 7,492,046 B2 | 2/2009 | Furukawa et al. |
| 7,572,682 B2 | 8/2009 | Yang et al. |
| 7,598,127 B2 | 10/2009 | Whitefield et al. |
| 7,745,810 B2 | 6/2010 | Rueckes et al. |
| 7,787,292 B2 | 8/2010 | Keshavarzi et al. |
| 8,101,529 B2 | 1/2012 | Narita |
| 8,237,142 B2 | 8/2012 | Cheung et al. |
| 8,463,090 B2 | 6/2013 | Donval et al. |
| 8,482,126 B2 | 7/2013 | Wada et al. |
| 8,647,978 B1 | 2/2014 | Ott et al. |
| 8,735,242 B2 | 5/2014 | Zhu |
| 2002/0096778 A1* | 7/2002 | Cox ............ H01L 21/32134 257/774 |
| 2004/0217481 A1 | 11/2004 | Farrar |
| 2006/0118962 A1* | 6/2006 | Huang ........... H01L 21/76805 257/760 |
| 2006/0292861 A1* | 12/2006 | Furukawa ........... B82Y 10/00 438/627 |
| 2007/0023914 A1 | 2/2007 | Farrar |
| 2007/0176255 A1 | 8/2007 | Kreupl et al. |
| 2007/0202676 A1* | 8/2007 | Yeh ............ H01L 21/02063 438/597 |
| 2008/0296728 A1 | 12/2008 | Yang et al. |
| 2010/0021708 A1 | 1/2010 | Kong et al. |
| 2011/0006425 A1* | 1/2011 | Wada ............ H01L 21/76807 257/750 |
| 2011/0059599 A1* | 3/2011 | Ward ............... B82Y 30/00 438/507 |
| 2011/0091647 A1 | 4/2011 | Colombo et al. |
| 2011/0101528 A1 | 5/2011 | Akimoto et al. |
| 2011/0115094 A1 | 5/2011 | Darnon et al. |
| 2011/0206934 A1* | 8/2011 | Bol ............... B82Y 30/00 428/408 |
| 2011/0210314 A1* | 9/2011 | Chung ............ H01L 29/1606 257/29 |
| 2011/0254082 A1 | 10/2011 | Jang |
| 2012/0006580 A1* | 1/2012 | Sandhu ........... H01L 23/53238 174/126.1 |
| 2012/0052680 A1* | 3/2012 | Sakuma ........... H01L 21/76876 438/675 |
| 2012/0074387 A1* | 3/2012 | King ............ H01L 21/02381 257/29 |
| 2012/0080661 A1* | 4/2012 | Saito ............ H01L 21/76876 257/29 |
| 2012/0080662 A1 | 4/2012 | Saito et al. |
| 2012/0080796 A1 | 4/2012 | Wada et al. |
| 2012/0139114 A1 | 6/2012 | Zhang et al. |
| 2012/0205626 A1 | 8/2012 | Dimitrakopoulos et al. |
| 2012/0256167 A1* | 10/2012 | Heo ............ H01L 29/1606 257/27 |
| 2013/0015581 A1* | 1/2013 | Wann ............ H01L 23/532769 257/751 |
| 2013/0056873 A1 | 3/2013 | Wada et al. |
| 2013/0098540 A1* | 4/2013 | Lee ............ H01L 29/42384 156/230 |
| 2013/0113102 A1 | 5/2013 | Bao et al. |
| 2013/0203222 A1 | 8/2013 | Chung et al. |
| 2013/0217226 A1* | 8/2013 | Kitamura .......... H01L 23/53276 438/652 |
| 2014/0070363 A1* | 3/2014 | Bao ............... H01L 23/5252 257/530 |
| 2014/0070425 A1 | 3/2014 | Wada et al. |
| 2014/0084250 A1* | 3/2014 | Wada ............... H01L 23/53276 257/29 |
| 2014/0138829 A1 | 5/2014 | Zhao et al. |
| 2014/0291819 A1* | 10/2014 | Barth ............... H01L 23/53276 257/659 |

FOREIGN PATENT DOCUMENTS

| | | |
|---|---|---|
| KR | 20070097764 A | 10/2007 |
| WO | 20140099428 A1 | 6/2014 |

OTHER PUBLICATIONS

Pending application 13716636, entitled "Graphene and Metal Interconnects", filed on Dec. 17, 2012.
Pending application 13873356, entitled "Hybrid Graphene-Metal Interconnect Structures", filed on Apr. 30, 2013.
Yu et al., "Bilayer Graphene/Copper Hybrid On-Chip Interconnect: A Reliability Study", IEEE Transactions on Nanotechnology, vol. 10, No. 4, Jul. 2011, pp. 710-714.
Li et al., "Graphene Films with Large Domain Size by a Two-Step Chemical Vapor Deposition Process", Nano Letters, 2010, vol. 10, pp. 4328-4334.
Li et al., "Low-Temperature Growth of Graphene by Chemical Vapor Deposition Using Solid and Liquid Carbon Sources", vol. 5, No. 4, pp. 3385-3390, 2011, ACSNANO.
Mattevi et al., "A review of chemical vapour deposition of graphene on copper†", www.rsc.org/materials, Journal of Materials Chemistry, 2011, vol. 21, pp. 3324-3334.
Murali et al., "Breakdown current density of graphene nanoribbons", Applied Physics Letters vol. 94, 2009, American Institute of Physics, pp. 243114-1-243114-3.
"New Graphene Fabrication Method uses Silicon Carbide Templates to Create Desired Growth", ScienceNewsline Technology, http://www.sciencenewsline.com/summary/2010100512000020.html, Accessed on Jul. 29, 2014, pp. 1-2.
Pollard, "Growing Graphene via Chemical Vapor Deposition", Department of Physics, Pomona College, May 2, 2011, pp. 1-47.
Yarris, "Graphene Films Clear Major Fabrication Hurdle", Apr. 8, 2010, News Center, http://newscenter.lbl.gov/2010/04108/graphene-films/, Accessed on Aug. 1, 2014, pp. 1-5.
Robertson et al., "Use of carbon nanotubes for VLSI interconnects", Diamond & Related Materials vol. 18, 2009, pp. 957-962.
Xia et al., "The origins and limits of metal-graphene junction resistance", Nature Nanotechnology, Articles, vol. 6, Mar. 2011, www.nature.com/naturenanotechnology, pp. 179-184.
Maruf, Office Action Communication for U.S. Appl. No. 13/873,356 dated Jun. 9, 2015, 16 pages.
Sutter et al., "Graphene growth on epitaxial Ru thin films on sapphire"; Received Oct. 6, 2010; accepted Oct. 29, 2010; published online Nov. 23, 2010; doi:10.1063/1.3518490; Copyright 2010 American Institute of Physics.
Lcyarris.; "Graphene Films Clear Major Fabrication Hurdle"; <http://newscenter.lbl.gov/feature-stories/2010/04/08/graphene-films/print/>; Copyright © 2008 Berkeley Lab News Center; Apr. 8, 2010; printed Nov. 15, 2012.
U.S. Appl. No. 13/551,962; entitled; "Use of Graphene to Limit Copper Surface Oxidation, Diffusion and Electromigration in Interconnect Structures", filed Jul. 18, 2012.
Pending U.S. Appl. No. 13/873,356, entitled: "Hybrid Graphene-Metal Interconnect Structures", filed Apr. 30, 2013.
Pending U.S. Appl. No. 13/716,636, entitled: "Graphene and Metal Interconnects", filed on Dec. 17, 2012.

* cited by examiner

SECTION A-A

SECTION B-B

SECTION C-C

SECTION D-D

GRAPHENE-METAL E-FUSE

BACKGROUND

The present invention generally relates to microelectronic interconnect structures, and particularly to hybrid graphene-metal lines.

Metal interconnect structures are the primary means of connecting microelectronic devices. Such interconnect structures typically take the shape of wires, trenches, or vias formed in dielectric layers above the microelectronic devices and may typically be formed by depositing a dielectric layer, etching a trench in the dielectric layer and filling the trench with a metal, for example copper.

However, as the dimensions of microelectronic devices continue to shrink, metal lines may possess inherent limitations that reduce performance and reliability. For example, the resistivity of metal lines may be too high to effectively transmit current to and from the microelectronic devices. Other materials such a graphene have lower resistivity and can therefore improve device performance. However, graphene presents numerous challenges which discourage its inclusion in typical interconnect structures. Therefore, a method incorporating graphene into metal interconnect structures is desirable.

SUMMARY

According to one embodiment of the present invention, a structure is provided. The structure may include an $M_x$ level including a first $M_x$ metal, a second $M_x$ metal, and a third $M_x$ metal abutting and electrically connected in sequence with one another, the second $M_x$ metal including graphene; and an $M_{x+1}$ level above the $M_x$ level, the $M_{x+1}$ level including an $M_{x+1}$ metal and a via, the via electrically connects the third $M_x$ metal to the $M_{x+1}$ metal in a vertical orientation.

According to another exemplary embodiment of the present invention, a method is provided. The method may include forming an $M_x$ level including a first $M_x$ metal, a second $M_x$ metal, and a third $M_x$ metal abutting and electrically connected in sequence with one another, the second $M_x$ metal including graphene, and forming an $M_{x+1}$ level above the $M_x$ level, the $M_{x+1}$ level including an $M_{x+1}$ metal and a via, the via electrically connecting the third $M_x$ metal to the $M_{x+1}$ metal in a vertical orientation.

According to another exemplary embodiment of the present invention, a method is provided. The method may include etching, in an $M_x$ dielectric layer, a first trench and a second trench, filling the first trench and the second trench with a metal to form a first $M_x$ metal, and a second $M_x$ metal, and forming a third trench abutting and in between the first $M_x$ metal and the second $M_x$ metal. The method may further include filling the third trench with graphene to form a third $M_x$ metal, the graphene of the third $M_x$ metal is in direct contact with the metal of both the first $M_x$ metal and the second $M_x$ metal, etching, in an $M_{x+1}$ dielectric layer, a dual damascene opening including a via opening and a trench, the via opening being directly above and exposing an upper surface of the second $M_x$ metal, and filling the via opening and the trench with the metal to form an $M_{x+1}$ via and an $M_{x+1}$ metal, the $M_{x+1}$ via being adjacent to the third $M_x$ metal and in direct contact with the second $M_x$ metal in the $M_x$ dielectric layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

Figure 1:
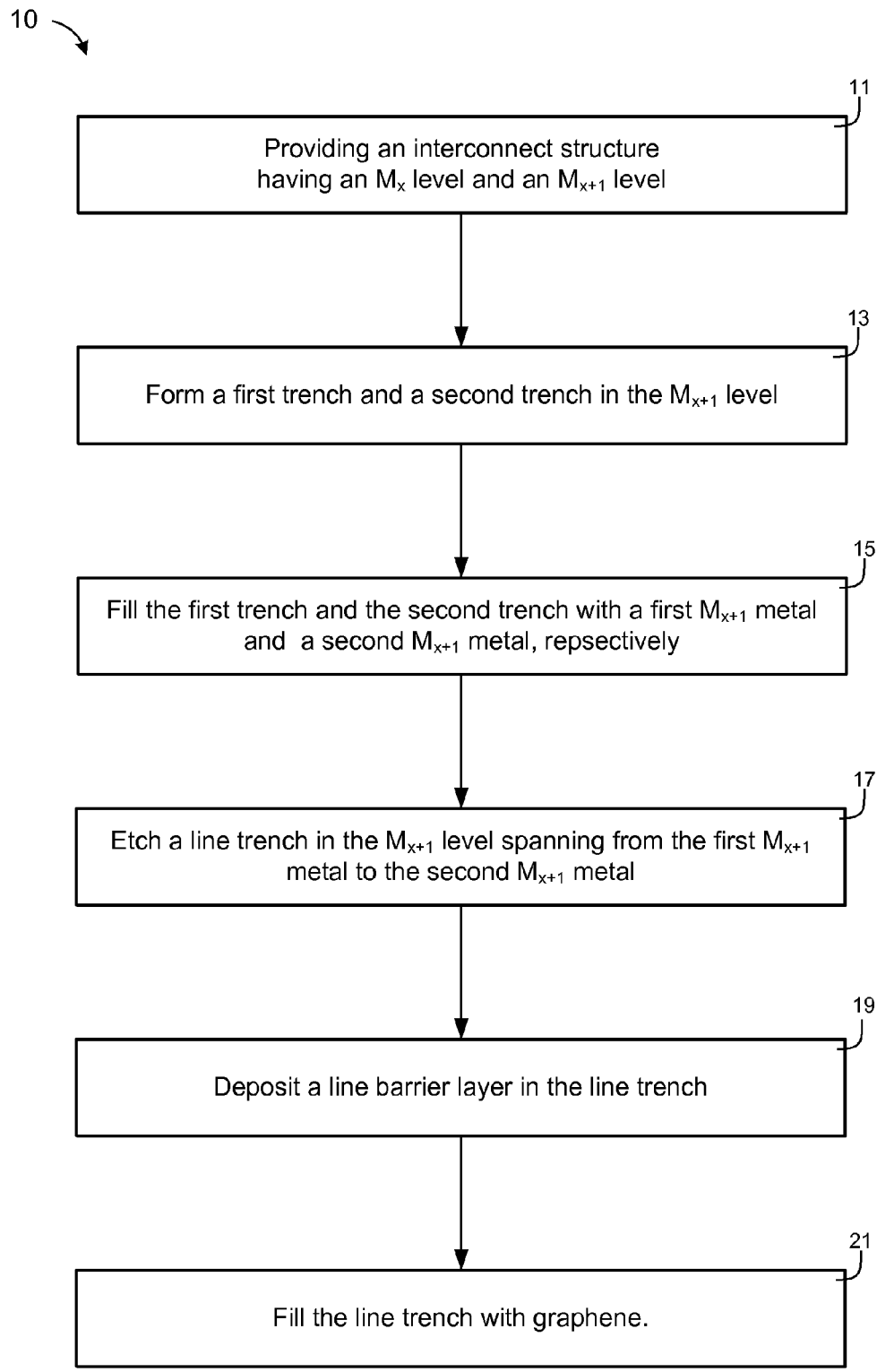
FIG. 1 is a flow chart of a method of forming a hybrid graphene-metal interconnect structure, according to an exemplary embodiment of the present invention.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the invention generally relate to methods of forming hybrid graphene-metal lines as part of a back-end-of-the-line (BEOL) interconnect level. FIG. 1 is a flow chart of a method of forming a hybrid graphene-metal line, according to an embodiment of the present invention. Referring to FIG. 1, the method 10 includes a step 11, providing an interconnect structure including an $M_x$ level and an $M_{x+1}$ level; a step 13, forming a first trench and a second trench in the $M_{x+1}$ level; a step 15, filling the first trench and the second trench with a first $M_{x+1}$ metal and a second $M_{x+1}$ metal, respectively; a step 17, etching a line trench in the $M_{x+1}$ level spanning from the first $M_{x+1}$ metal to the second $M_{x+1}$ metal; a step 19, depositing a line barrier layer in the line trench; and a step 21, filling the line trench with graphene.

Figure 2A:
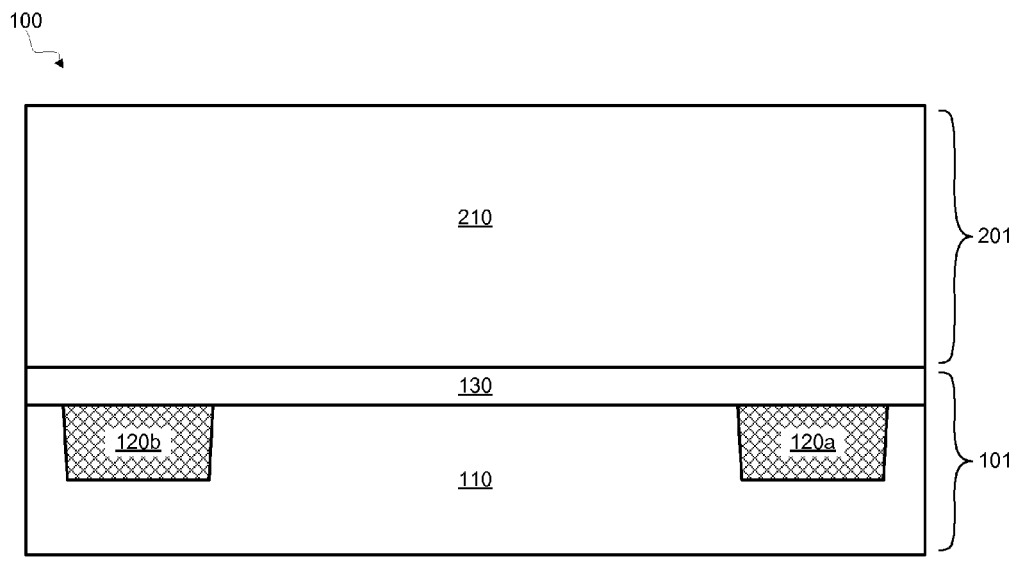
FIG. 2A is a cross-sectional view of an interconnect structure having an $M_x$ level including an $M_x$ dielectric, a first $M_x$ metal, a second $M_x$ metal, and an $M_x$ capping layer, and an $M_{x+1}$ level including an $M_{x+1}$ dielectric, according to an exemplary embodiment of the present invention.

At 11, described in conjunction with FIG. 2A, an interconnect structure 100 may be provided. The interconnect structure 100 may include an $M_x$ level 101 and an $M_{x+1}$ level 201. The $M_x$ level 101 and the $M_{x+1}$ level 201 may be any adjacent interconnect levels in the interconnect structure 100. It should be noted that while only two interconnect levels are shown, the interconnect structure 100 may include multiple interconnect levels below the $M_x$ level 101. The $M_x$ level 101 may include an $M_x$ dielectric 110, a first $M_x$ metal 120a, a second $M_x$ metal 120b, and an $M_x$ capping layer 130. In some embodiments, the $M_x$ level 101 may not include the first $M_x$ metal 120a and/or the second $M_x$ metal 120b. The $M_{x+1}$ level 201 may include an $M_{x+1}$ dielectric 210.

With continued reference to FIG. 2A, The $M_x$ dielectric 110 may include any suitable dielectric material, for example, silicon oxide, silicon nitride, hydrogenated silicon carbon oxide, silicon based low-k dielectrics, porous dielectrics, or organic dielectrics including porous organic dielectrics. The $M_x$ dielectric 110 may be formed using known suitable deposition techniques, such as, for example, atomic layer deposition (ALD), chemical vapor deposition (CVD), plasma enhanced chemical vapor deposition, spin on deposition, or physical vapor deposition (PVD). The $M_x$ dielectric 110 may have a thickness ranging from approximately 70 nm to approximately 140 nm, although greater and lesser thicknesses are explicitly contemplated.

With continued reference to FIG. 2A, the first $M_x$ metal 120a and the second $M_x$ metal 120b may be, for example, typical lines, vias, or wires found in a typical interconnect structure. The first $M_x$ metal 120a and the second $M_x$ metal 120b may be made of a conductive interconnect material including, for example, copper, aluminum, or tungsten. The conductive interconnect material may be formed using a filling technique such as electroplating, electroless plating, chemical vapor deposition, physical vapor deposition or a combination of methods. The conductive interconnect material may further include a dopant, such as, for example, manganese, magnesium, copper, aluminum, or other known dopants. In some embodiments, various barriers or liners (not shown) may be formed in the $M_x$ level 101 between first $M_x$ metal 120a and the $M_x$ dielectric 110 and between second $M_x$ metal 120b and the $M_x$ dielectric 110. In one embodiment, a liner may include, for example, a tantalum nitride layer, followed by a tantalum layer. Other barrier liners may include manganese, cobalt or ruthenium, either alone or in combination with any other suitable liner.

With continued reference to FIG. 2A, the $M_x$ capping layer 130 may include, for example, silicon nitride, silicon carbide, silicon carbon nitride, hydrogenated silicon carbide, or other known capping materials. The $M_x$ capping layer 130 may have a thickness ranging from approximately 20 nm to approximately 60 nm and ranges there between, although greater and lesser thicknesses are explicitly contemplated.

With continued reference to FIG. 2A, the $M_{x+1}$ dielectric 210 may be substantially similar to the $M_x$ dielectric 110 described above and may be formed by similar known deposition techniques. Because a portion of the $M_{x+1}$ dielectric 210 may be removed during subsequent fabrication steps, the $M_{x+1}$ dielectric 210 may have an initial thickness greater than desired in the ultimate structure. In some embodiments, the $M_{x+1}$ dielectric 210 may have an initial thickness ranging from approximately 90 nm to approximately 200 nm, although greater and lesser thicknesses are explicitly contemplated.

Figure 2B:
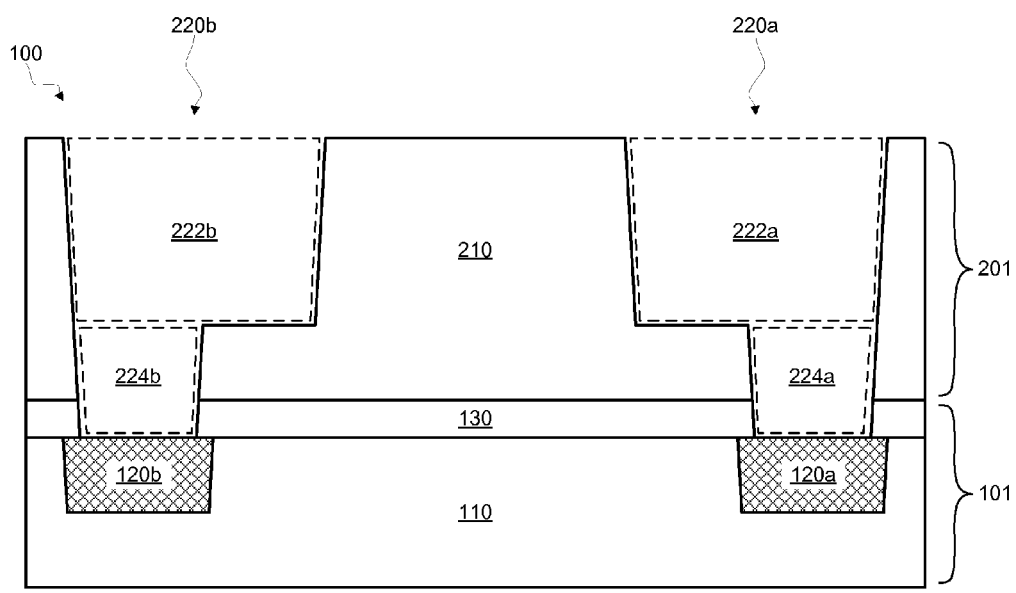
FIG. 2B is a cross-sectional view depicting forming a first trench and a second trench in the $M_{x+1}$ level, according to an exemplary embodiment of the present invention.

At 13, described in conjunction with FIG. 2B, a first trench 220a and a second trench 220b may be formed in the $M_{x+1}$ level 201. The first trench 220a and the second trench 220b may be formed using a dual damascene process. The first trench 220a may include a via portion 224a and a line portion 222a and the second trench 220b may include a via portion 224b and a line portion 222b. Via portions 224a and 224b may be formed through the $M_x$ capping layer 130 to expose a portion of the first $M_x$ metal 120a and the second $M_x$ metal 120b, respectively. In some embodiments, via portions 224a and/or 224b may be absent. Line portions 222a and 222b may have a depth ranging from approximately 50 nm to approximately 160 nm, although greater and lesser thicknesses are explicitly contemplated. Because a portion of line portions 222a and 222b may be removed during subsequent fabrication steps, Line portions 222a and 222b may have an initial depth greater than desired in the ultimate structure.

Figure 2C:
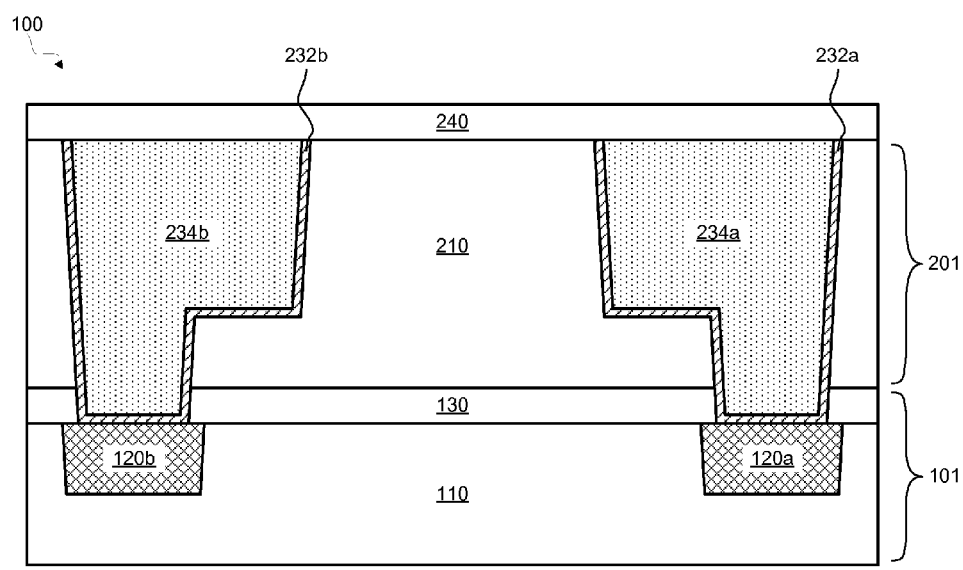
FIG. 2C is a cross-sectional view depicting forming a first $M_{x+1}$ metal in the first trench of the $M_{x+1}$ level, a second $M_{x+1}$ metal in the second trench of the $M_{x+1}$ level, and an $M_{x+1}$ capping layer above the $M_{x+1}$ dielectric, according to an exemplary embodiment of the present invention.

At 15, described in conjunction with FIG. 2C, a first $M_{x+1}$ metal 234a and a second $M_{x+1}$ metal 234b may be formed in the first trench 220a and the second trench 220b, respectively. The first $M_{x+1}$ metal 234a and the second $M_{x+1}$ metal 234b may be made of a conductive interconnect material, including, for example, gold, copper, aluminum, or tungsten, and may be formed using a filling technique such as electroplating, electroless plating, chemical vapor deposition, physical vapor deposition or a combination of methods. The conductive interconnect material may further include a dopant, such as, for example, manganese (Mn), magnesium (Mg), copper (Cu), aluminum (Al) or other known dopants.

With continued reference to FIG. 2C, liners 232a and 232b may be formed in the first trench 220a and the second trench 220b, respectively, using typical deposition techniques, such as CVD or ALD, prior to forming the first $M_{x+1}$ metal 234a and the second $M_{x+1}$ metal 234b. Liners 232a and 232b layer may include typical interconnect barrier materials, such as tantalum, tantalum nitride, and combinations thereof or titanium, titanium nitride and combinations thereof. Other liner materials may include manganese, cobalt or ruthenium, either alone or in combination with any other suitable liner. In other embodiments the thin liner layer may be a silicon nitride or SiNCOH layer. Liners 232a and 232b may have a thickness ranging from approximately 1 nm to approximately 10 nm, although greater and lesser thicknesses are explicitly contemplated.

With continued reference to FIG. 2C, a sacrificial protective layer 240 may be formed above the $M_{x+1}$ level 201. While the sacrificial protective layer 240 may be excluded in some embodiments, it may be included to at least protect the first $M_{x+1}$ metal 234a and the second $M_{x+1}$ metal 234b during subsequent processing steps. In some embodiments, the sacrificial protective layer 240 may be substantially similar to the $M_x$ capping layer 130 and be formed using similar methods. In other embodiments, any suitable protective layer may be used.

Figure 2D:
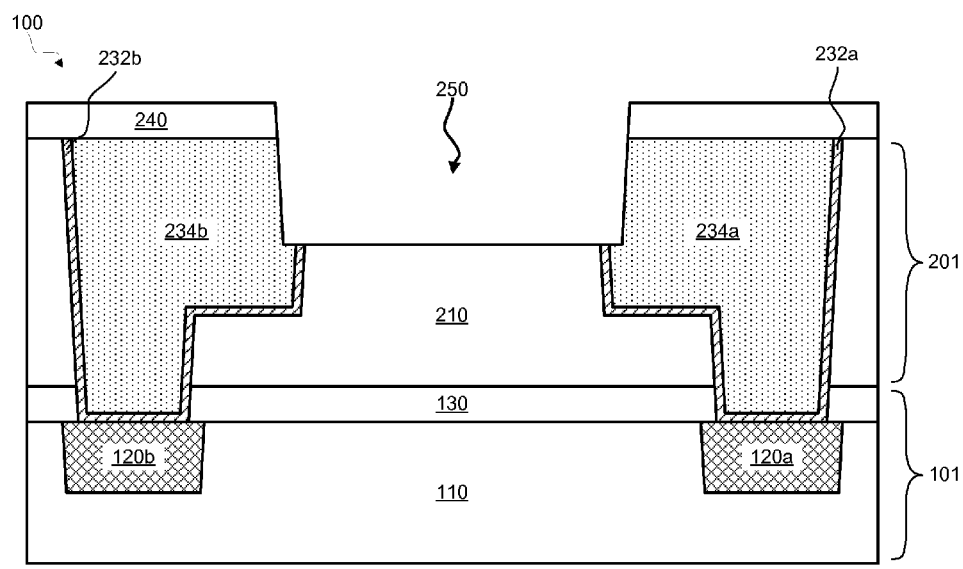
FIG. 2D is a cross-sectional view depicting etching a $M_{x+1}$ line trench in the $M_{x+1}$ level, according to an exemplary embodiment of the present invention.

At 17, described in conjunction with FIG. 2D, a line trench 250 may be formed in the $M_{x+1}$ level 201 between the first $M_{x+1}$ metal 234a and the second $M_{x+1}$ metal 234b. The line trench 250 may span the distance between the first $M_{x+1}$ metal 234a and the second $M_{x+1}$ metal 234b so that the line trench 250 exposes a portion of the first $M_{x+1}$ metal 234a and the second $M_{x+1}$ metal 234b. In an alternate embodiment, the line trench 250 may be etched so that a portion of the liners 232a and 232b may be preserved between the line trench 250 and the first $M_{x+1}$ metal 234a and the second $M_{x+1}$ metal 234b. The line trench 250 may have a depth less than or equal to about 50% of the depth of the line portions 222a, 222b, above. In an embodiment, the line trench 250 may have a depth ranging from approximately 25 nm to approximately 80 nm, measured from the top surface of the dielectric layer 210, although greater and lesser depths are explicitly contemplated. The line trench 250 may be formed by any suitable anisotropic etching technique, including, for example, reactive ion etching (RIE) or plasma etching. Exemplary etching techniques may be fluorine-based, including, for example, $CF_4$ plasma etching.

Figure 2E:
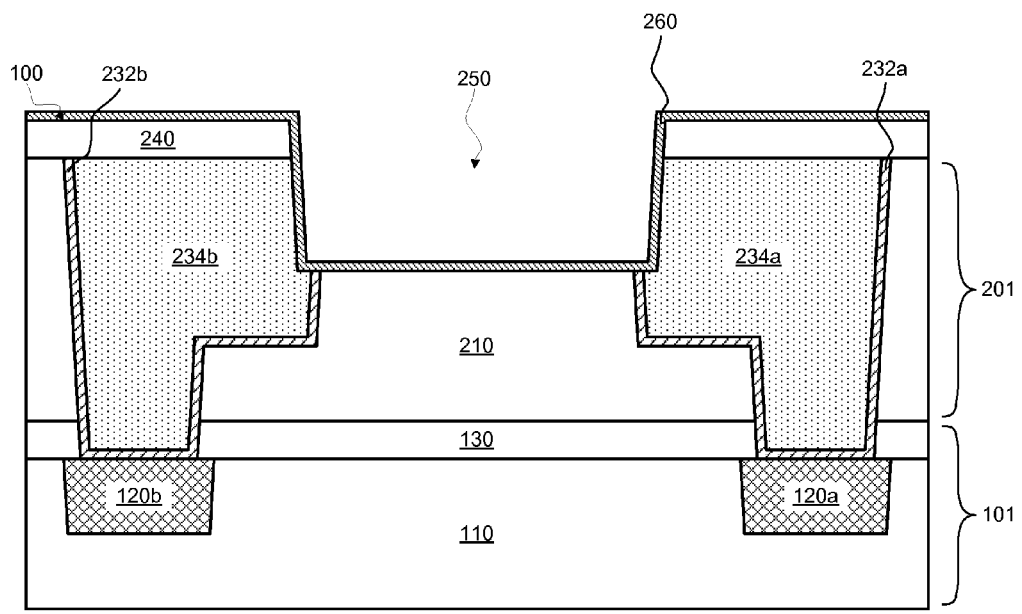
FIG. 2E is a cross-sectional view depicting depositing a line barrier layer in the $M_{x+1}$ line trench, according to an exemplary embodiment of the present invention.
Figure 2F:
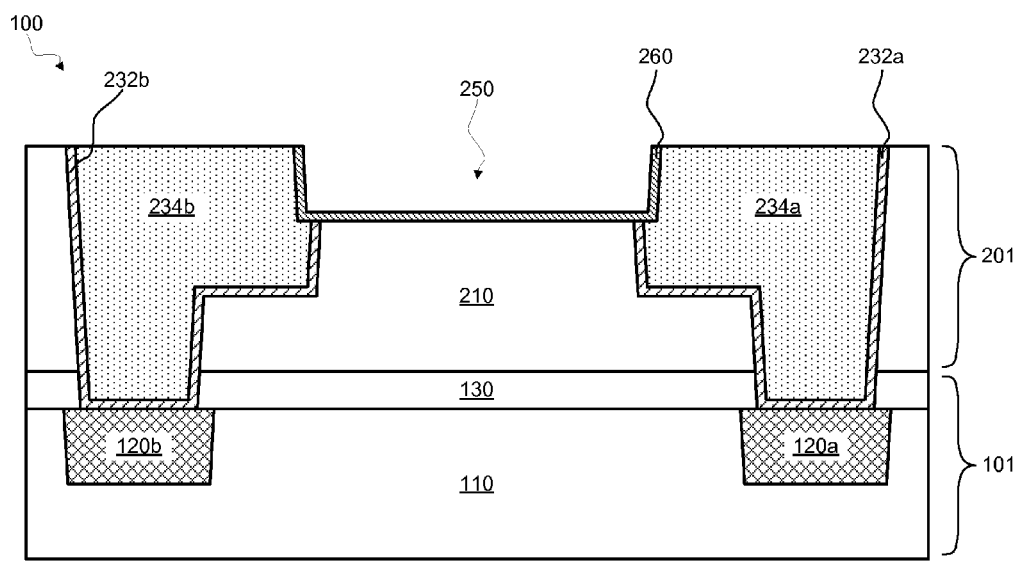
FIG. 2F is a cross-sectional view depicting planarizing the $M_{x+1}$ level, according to an exemplary embodiment of the present invention.

At 19, described in conjunction with FIG. 2E-2F, a line barrier layer 260 may be formed in the line trench 250. Referring to FIG. 2E, the line barrier layer 260 may include a barrier material and a graphene seed material. The barrier material may improve adherence of the graphene seed material to the sidewalls of the line trench 250 while also serving as an electromigration barrier between a graphene line to be subsequently formed in the line trench 250 and the first $M_{x+1}$ metal 234a and the second $M_{x+1}$ metal 234b. Exemplary barrier materials include the materials of the liners 232a and 232b, including tantalum, tantalum nitride, and combinations thereof or titanium, titanium nitride and combinations thereof. The graphene seed material may be any material capable of aiding the formation of the graphene line to be subsequently formed in the line trench 250. In an exemplary embodiment, the graphene seed material may be ruthenium. Alternatively, the graphene seed material may include ruthenium, nickel, palladium, iridium, copper, or any combination thereof. The most appropriate graphene seed material may depend on the specific graphene deposition or growth process used.

Referring to FIG. 2F, the $M_{x+1}$ level 201 may be planarized using, for example, chemical-mechanical planarization (CMP) to remove excess material from the line barrier layer 260 and the sacrificial protective layer 240. The CMP process may use the first $M_{x+1}$ metal 234a and the second $M_{x+1}$ metal 234b as a planarization stop, though some amount of overpolishing, resulting in removal of a top portion of first $M_{x+1}$ metal 234a and the second $M_{x+1}$ metal 234b, may be acceptable. After planarization, the depth of the line trench 250 may be reduced to a range from approximately 2 nm to approximately 5 nm, including the thickness of the line barrier layer 260, although greater and lesser depths are explicitly contemplated.

Figure 2G:
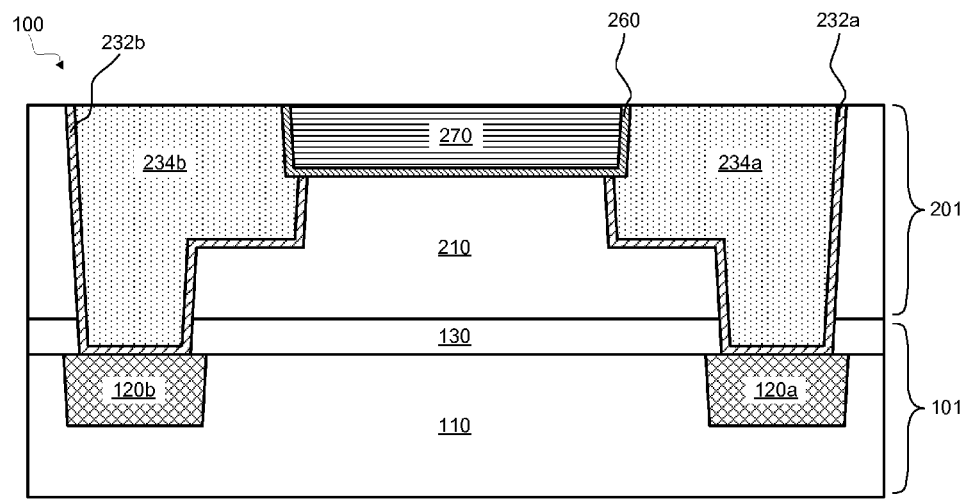
FIG. 2G is a cross-sectional view depicting filling the $M_{x+1}$ line trench with graphene, according to an exemplary embodiment of the present invention.

At 21, described in conjunction with FIG. 2G, a graphene line 270 may be formed in the line trench 250, so that the graphene line 270 abuts and is electrically connected to the first $M_{x+1}$ metal 234a and the second $M_{x+1}$ metal 234b while being separated from the first $M_{x+1}$ metal 234a and the second $M_{x+1}$ metal 234b by the line barrier layer 260. The graphene line 270 may be formed using any method known in the art capable of forming a graphene region that conducts electricity between the first $M_{x+1}$ metal 234a and the second $M_{x+1}$ metal 234b. In an exemplary embodiment, the graphene line 270 may include multilayer graphene deposited using CVD with either solid or liquid precursors at a temperature ranging from approximately 300° C. and approximately 400° C., although greater and lesser temperatures are explicitly contemplated. It may be preferable to use a graphene formation process within this temperature range or lower to avoid damage to other elements of the interconnect structure 100 or any underlying microelectronic devices (not shown). However, graphene formation processes that require higher temperatures may also be acceptable. In particular, the graphene line 270 may easily be integrated in to current semiconductor process flows. Graphene may be a suitable material from which to form an interconnect structure, unlike carbon nanotubes, because of its 2D characteristics. For example, carbon nanotubes, which have a similar composition to graphene however packaged in a different shape, may not be suitable to form the graphene line 270. In particular, carbon nanotubes are substantially one dimensional as opposed to graphene layers which are substantially two dimensional, thus affecting electron mobility. Also, purification processes and processing temperatures in excess of 3000° C. may be required to fabricate carbon nanotubes, which may be detrimental to surrounding structures existing at the time of fabrication.

With continued reference to FIG. 2G, the graphene line 270 electrically connects the first $M_{x+1}$ metal 234a and the second $M_{x+1}$ metal 234b. In other embodiments where the graphene line 270 is made of multi-layer graphene, current may travel from one graphene layer into another. However, there is generally higher electrical resistance between individual graphene layers. Therefore, current may travel primarily in a direction parallel to the length of the graphene line 270.

After forming the graphene line 270, an $M_{x+1}$ capping layer (not shown) and an $M_{x+2}$ dielectric layer (not shown) may be deposited above the $M_{x+1}$ dielectric layer and the process described above in conjunction with FIGS. 2B-2G may be repeated to form an $M_{x+2}$ level containing an additional hybrid graphene metal line. Due to the material properties of the graphene line 270, it may be difficult to form a reliable electrical connection directly to the graphene line 270. However, because both ends of the graphene line 270 are attached to a metal structure (i.e., the first $M_{x+1}$ metal 234a and the second $M_{x+1}$ metal 234b), it may be possible to avoid making any electrical connections to the graphene line 270. Instead, electrical connections from the $M_{x+2}$ level may be made to the first $M_{x+1}$ metal 234a and the second $M_{x+1}$ metal 234b.

Figure 2H:
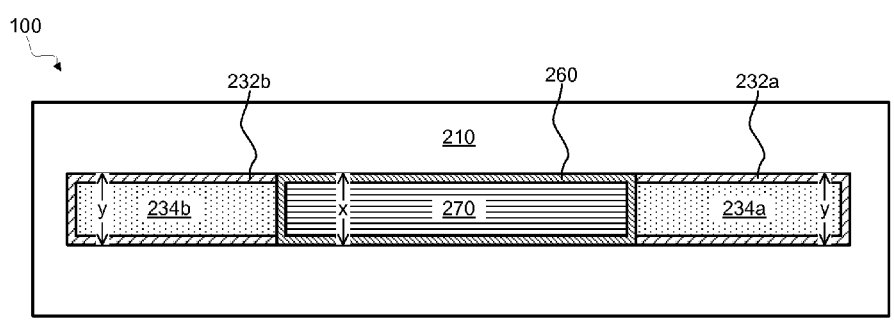
FIG. 2H is a top view depicting the formed graphene line of FIG. 2G, according to an exemplary embodiment of the present invention.
Figure 2I:
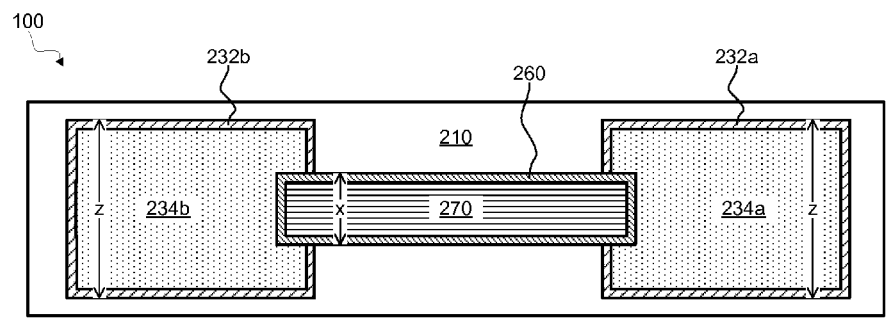
FIG. 2I is a top view depicting the formed graphene line of FIG. 2G, according to an exemplary embodiment of the present invention.

FIGS. 2H-2I depict top views of FIG. 2G, according to several embodiments of the present invention. Referring to FIG. 2H, the graphene line 270 may have a width (x) and the first $M_{x+1}$ metal 234a and the second $M_{x+1}$ metal 234b may have a width of (y), where (x) and (y) are approximately equal. In an exemplary embodiment, (x) may range from approximately 5 nm to approximately 40 nm and (y) may range from approximately 5 nm to approximately 40 nm. However, embodiments where the graphene line 270, the first $M_{x+1}$ metal 234a, and the second $M_{x+1}$ metal 234b have greater or lesser widths are explicitly contemplated.

Due to the potentially greater conductivity of the graphene line 270, the first $M_{x+1}$ metal 234a and the second $M_{x+1}$ metal 234b may restrict the flow of current through the $M_{x+1}$ level 201 in embodiments where the first $M_{x+1}$ metal 234a and the second $M_{x+1}$ metal 234b have approximately the same width as the graphene line 270. To improve current flow, in some embodiments the graphene line 270 may have a width (x) and the first $M_{x+1}$ metal 234a and the second $M_{x+1}$ metal 234b may have a width of (z), where (z) is greater than (x). In some embodiments (z) may range from approximately 100% to approximately 300% of (x). In an exemplary embodiment where (z) is approximately 300% of (x), (x) may range from approximately 5 nm to approximately 40 nm and (z) may range from approximately 15 nm to approximately 120 nm, although greater and lesser widths are explicitly contemplated.

Figure 3:
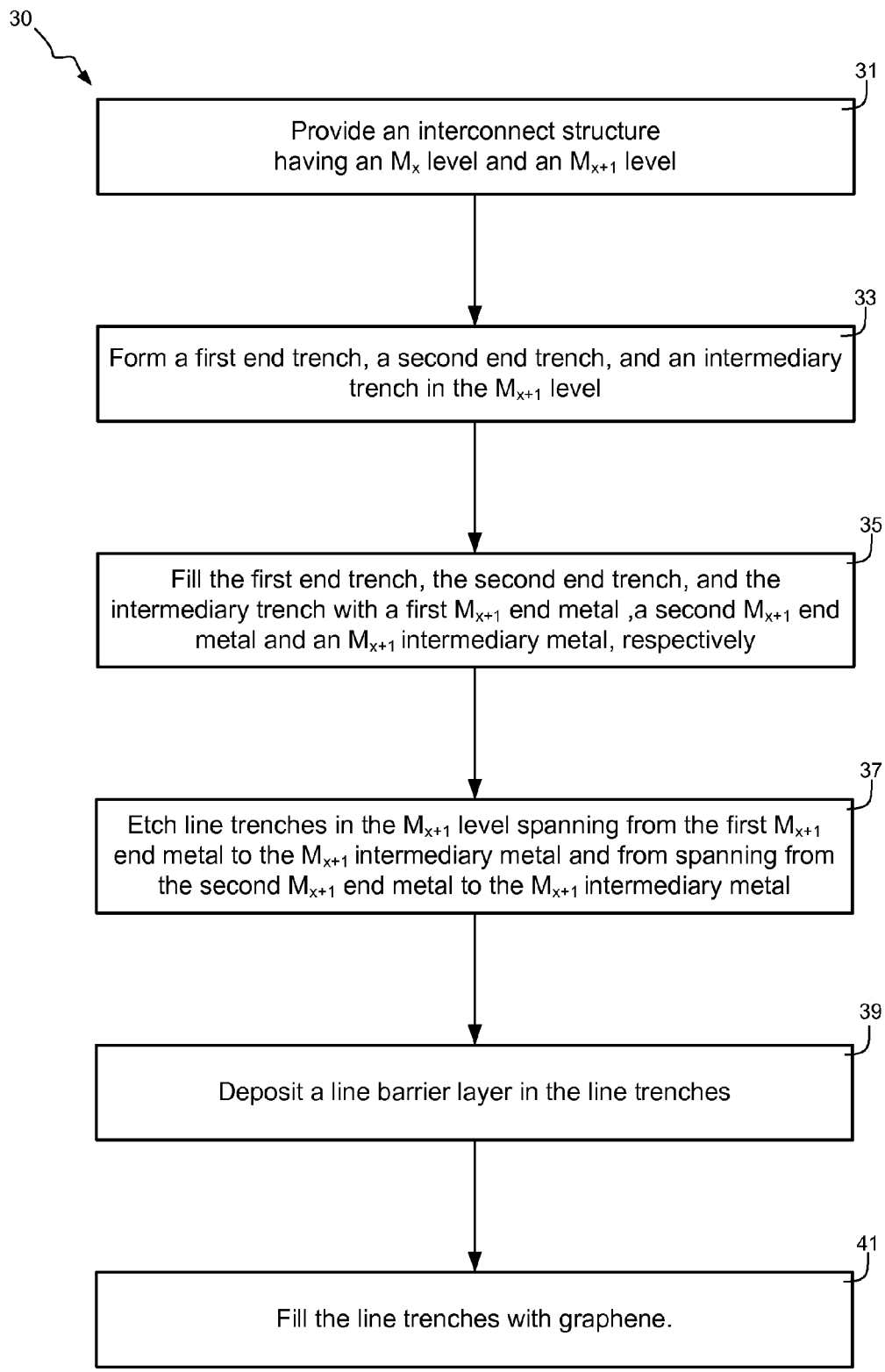
FIG. 3 is a flow chart of a method of forming a hybrid graphene-metal interconnect structure, according to another exemplary embodiment of the present invention.

FIG. 3 is a flow chart of a method of forming a hybrid graphene-metal line, according to an embodiment of the present invention. The hybrid graphene-metal line includes two metal ends and at least one intermediate metal connected to the metal ends by graphene lines. By controlling the lengths of the graphene lines and the intermediate metals, the overall performance of the hybrid graphene-metal line may be increased.

Referring to FIG. 3, the method 30 includes a step 31, providing an interconnect structure including an $M_x$ level and an $M_{x+1}$ level; a step 33, forming a first end trench, a second end trench, and an intermediary trench in the $M_{x+1}$ level; a step 35, filling the first end trench, the second end trench, and the intermediary trench with a first $M_{x+1}$ end metal, a second $M_{x+1}$ end metal and an $M_{x+1}$ intermediary metal, respectively; a step 37, etching line trenches in the $M_{x+1}$ level spanning from the first $M_{x+1}$ end metal to the $M_{x+1}$ intermediary metal and from spanning from the second $M_{x+1}$ end metal to the $M_{x+1}$ intermediary metal; a step 39, depositing line barrier layers in the line trenches; and a step 41, filling the line trenches with graphene.

At 31, the interconnect structure 100 described above in conjunction with FIG. 4A may be provided.

Figure 4A:
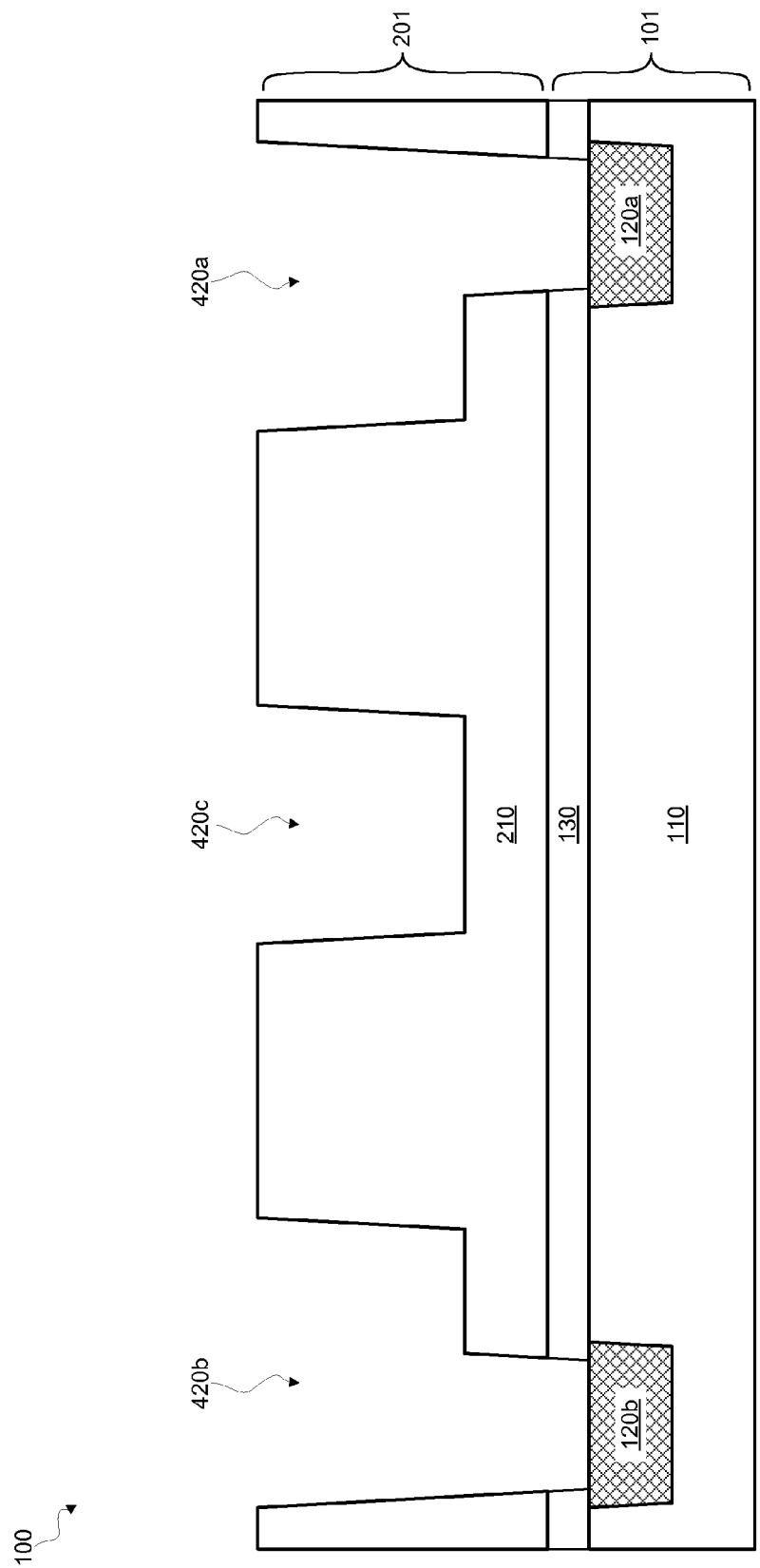
FIG. 4A is a cross-sectional view depicting forming a first end trench, a second end trench, and an intermediate trench in the $M_{x+1}$ level, according to an exemplary embodiment of the present invention.

At 33, described in conjunction with FIG. 4A, a first end trench 420a, a second end trench 420b, and an intermediate trench 420c may be formed in the $M_{x+1}$ level 201. The first end trench 420a and the second end trench 420b may be formed by substantially the same methods as the first trench 220a (FIG. 2B) and the second trench 220b (FIG. 2B). The intermediate trench 420c may be formed in the $M_{x+1}$ level 201 between the first end trench 420a and the second end trench 420b using, for example, a dual damascene process.

Figure 4B:
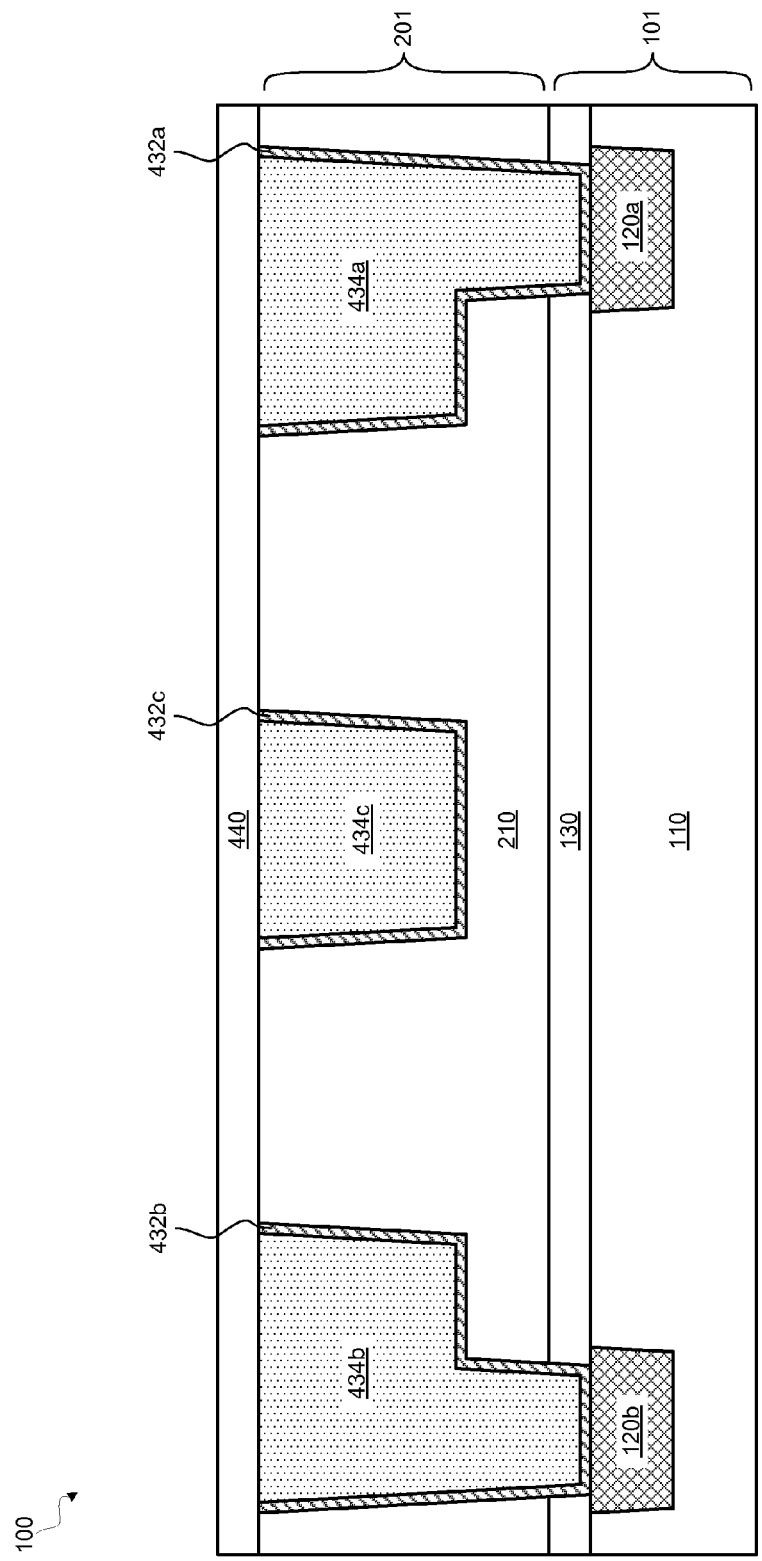
FIG. 4B is a cross-sectional view depicting forming a first $M_{x+1}$ end metal in the first end trench of the $M_{x+1}$ level, a second $M_{x+1}$ end metal in the second end trench of the $M_{x+1}$ level, an $M_{x+1}$ intermediate metal in the intermediate trench of the $M_{x+1}$ level, and an $M_{x+1}$ capping layer above the $M_{x+1}$ dielectric according to an exemplary embodiment of the present invention.

At 35, described in conjunction with FIG. 4B, a first $M_{x+1}$ end metal 434a, a second $M_{x+1}$ end metal 434b, and an $M_{x+1}$ intermediate metal 434c may be formed in the first end trench 420a, the second end trench 420b, and the intermediate trench 420c respectively. The first $M_{x+1}$ end metal 434a, the second $M_{x+1}$ end metal 434b, and the $M_{x+1}$ intermediate metal 434c may be made of substantially the same materials and formed by substantially the same methods as the first $M_{x+1}$ metal 234a and a second $M_{x+1}$ metal 234b.

With continued reference to FIG. 4B, liners 432a-432c may be formed in the first end trench 420a, the second end trench 420b, and the intermediate trench 420c, respectively, prior to forming, the first $M_{x+1}$ end metal 434a, the second $M_{x+1}$ end metal 434b, and the $M_{x+1}$ intermediate metal 434c. Liners 432a-432c may be made of substantially the same materials and formed by substantially the same methods as liners 232a and 232b.

With continued reference to FIG. 4B, a sacrificial protective layer 440 may be formed above the $M_{x+1}$ level 201. The sacrificial protective layer 440 may be made of substantially the same materials and formed by substantially the same methods as the sacrificial protective layer 240.

Figure 4C:
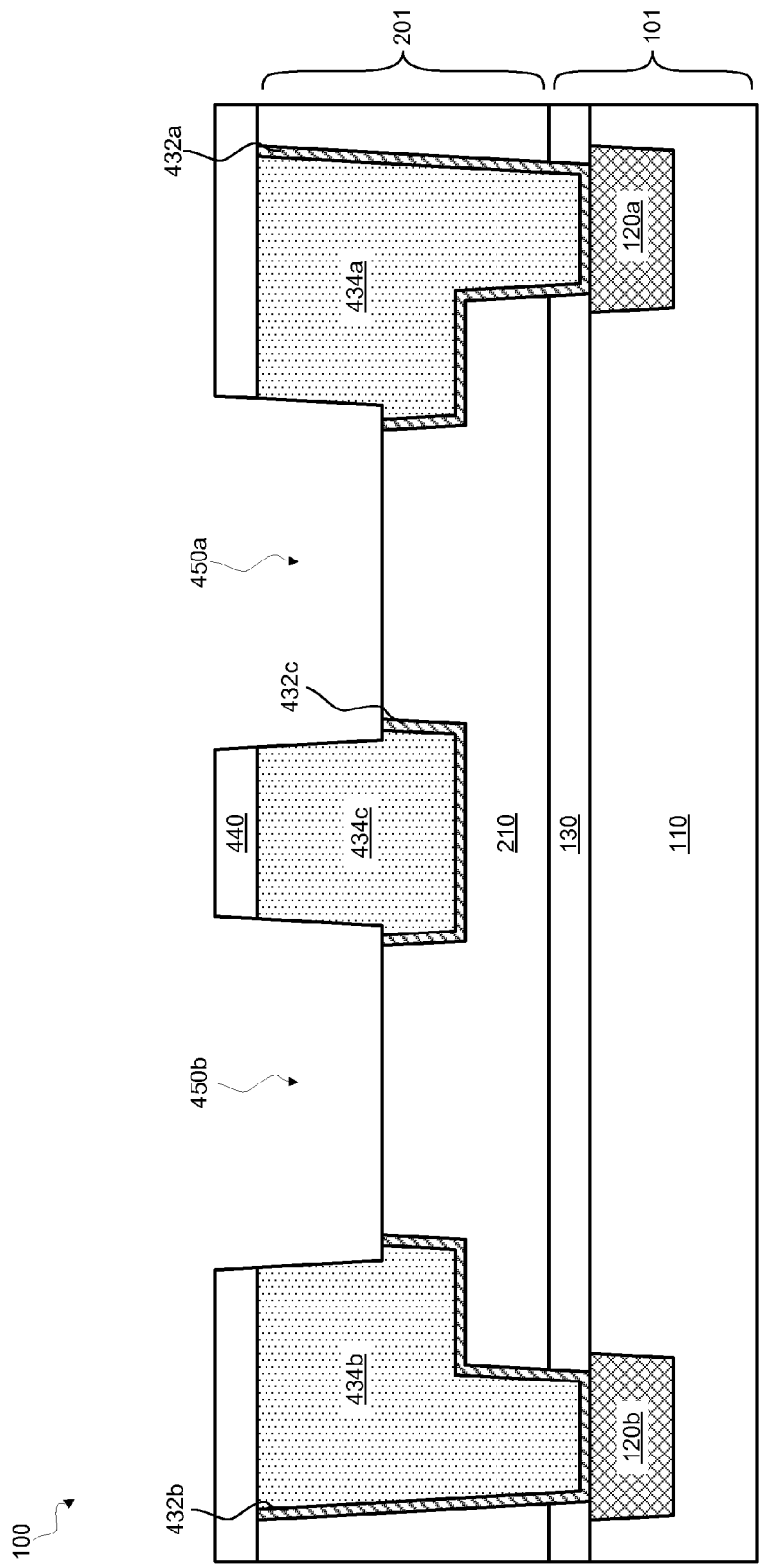
FIG. 4C is a cross-sectional view depicting etching a first $M_{x+1}$ line trench in the $M_{x+1}$ level between the first $M_{x+1}$ end metal and the $M_{x+1}$ intermediate metal and a second $M_{x+1}$ line trench in the $M_{x+1}$ level between the second $M_{x+1}$ end metal and the $M_{x+1}$ intermediate metal, according to an exemplary embodiment of the present invention.

At 37, described in conjunction with FIG. 4C, a first line trench 450a and a second line trench 450b may be formed in the $M_{x+1}$ level 201. The first line trench 450a may span the distance between the first $M_{x+1}$ end metal 434a and the $M_{x+1}$ intermediate metal 434c so that the first line trench 450a exposes a portion of the first $M_{x+1}$ end metal 434a and the $M_{x+1}$ intermediate metal 434c. The second line trench 450b may span the distance between the second $M_{x+1}$ end metal 434b and the $M_{x+1}$ intermediate metal 434c so that the first line trench 450b exposes a portion of the second $M_{x+1}$ end metal 434b and the $M_{x+1}$ intermediate metal 434c. The first line trench 450a and the second line trench 450b may have a depth ranging from approximately 25 nm to approximately 80 nm, measured from the top surface of the dielectric layer 210, although greater and lesser depths are explicitly contemplated. The first line trench 450a and the second line trench 450b formed by substantially the same methods as the line trench 250.

Figure 4D:
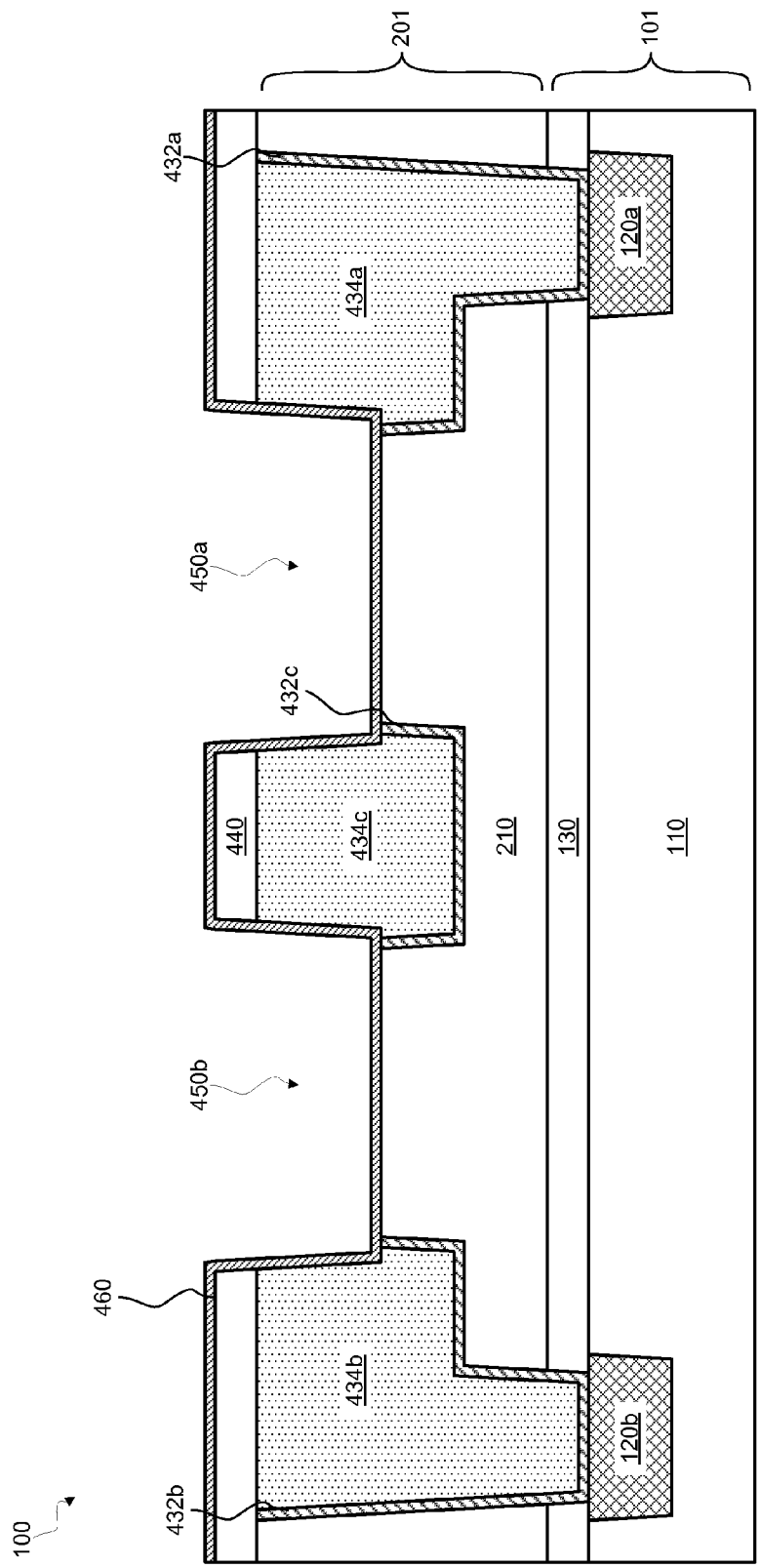
FIG. 4D is a cross-sectional view depicting depositing a line barrier layer in the first $M_{x+1}$ line trench and the second $M_{x+1}$ line trench, according to an exemplary embodiment of the present invention.
Figure 4E:
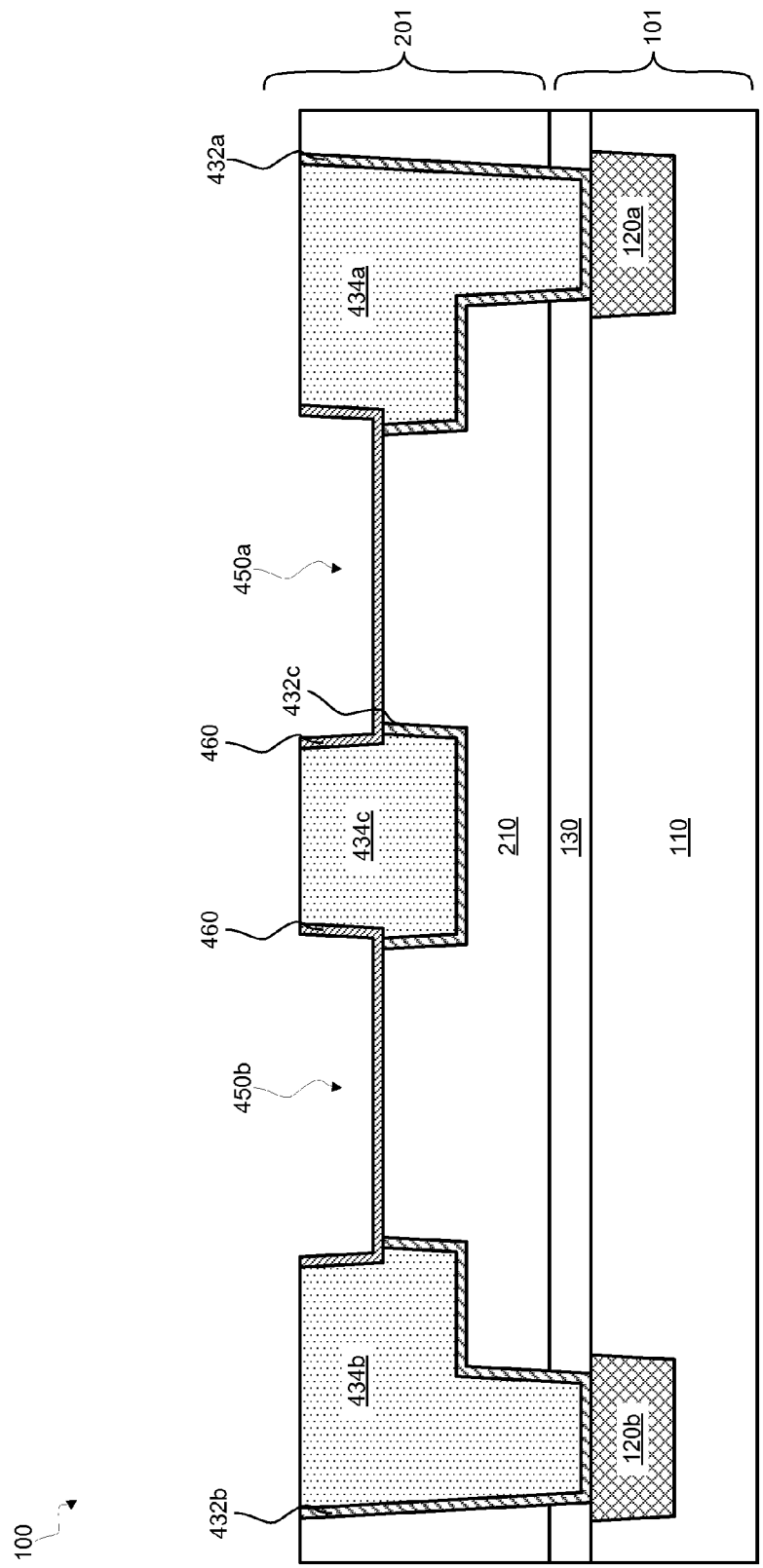
FIG. 4E is a cross-sectional view depicting planarizing the $M_{x+1}$ level, according to an exemplary embodiment of the present invention.

At 39, described in conjunction with FIG. 4D-4E, a line barrier layer 460 may be formed in the first line trench 450a and the second line trench 450b. The line barrier 460 may be made of substantially the same materials and formed by substantially the same methods as the line barrier layer 260.

Referring to FIG. 4E, the $M_{x+1}$ level 201 may be planarized using, for example, chemical-mechanical planarization (CMP) to remove excess material from the line barrier layer 460 and the sacrificial protective layer 440. The CMP process may use the first $M_{x+1}$ end metal 434a the second $M_{x+1}$ end metal 434b, and the $M_{x+1}$ intermediate metal 434c as a planarization stop, though some amount of overpolishing, resulting in removal of a top portion of first $M_{x+1}$ end metal 434a, the second $M_{x+1}$ end metal 434b, and the $M_{x+1}$ intermediate metal 434c may be acceptable. After planarization, the depth of the line trenches 450a-450b may be reduced to a range from approximately 2 nm to approximately 5 nm, including the thickness of the barrier layer 460, although greater and lesser depths are explicitly contemplated.

Figure 4F:
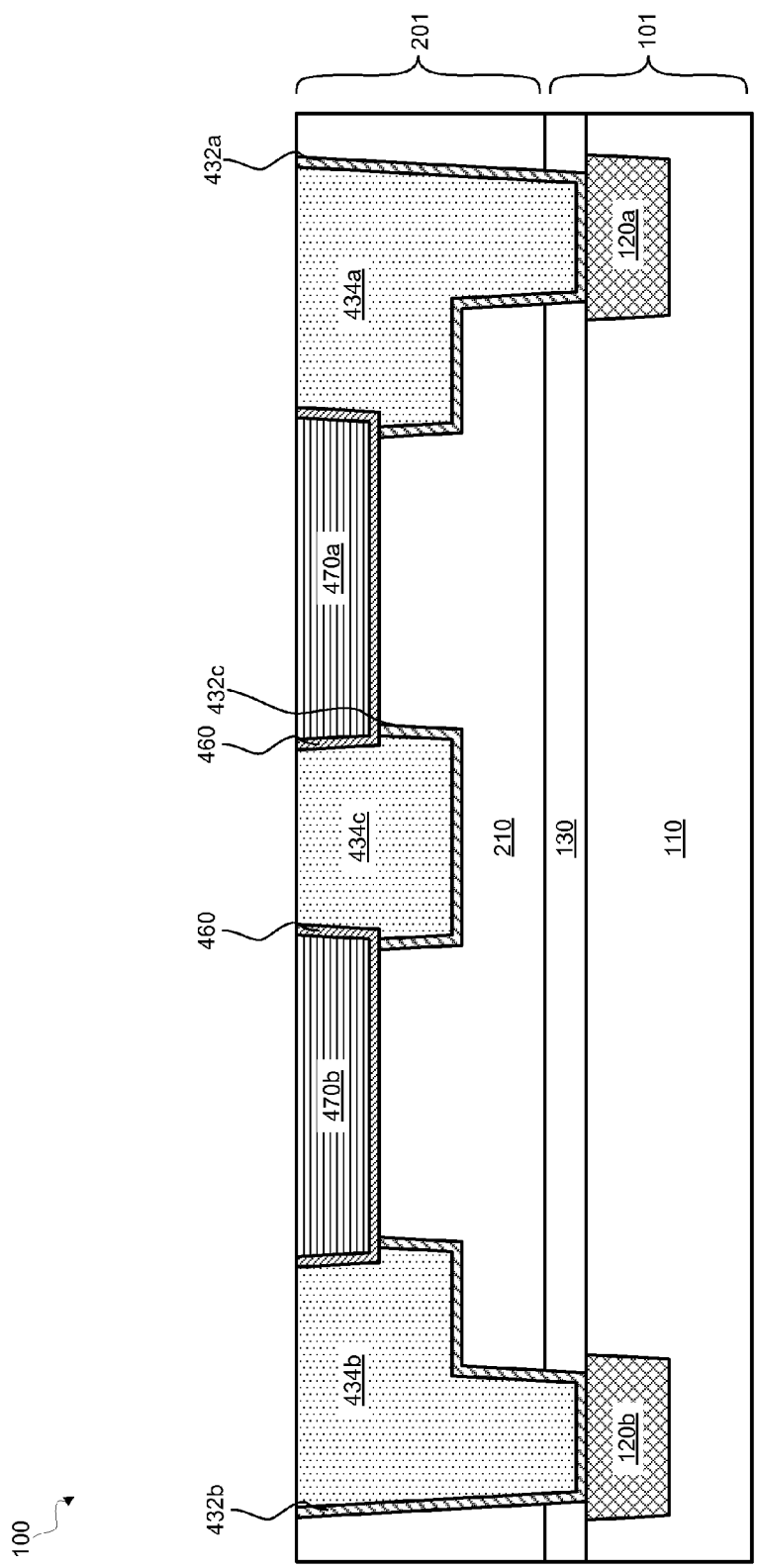
FIG. 4F is a cross-sectional view depicting filling the first $M_{x+1}$ line trench and the second $M_{x+1}$ line trench with graphene, according to an exemplary embodiment of the present invention.

At 41, described in conjunction with FIG. 4F, graphene lines 470a-470b may be formed in the first line trench 450a and the second line trench 450b, so that the graphene lines 470a-470b abut and are electrically connected to the $M_{x+1}$ end metal 434a the second $M_{x+1}$ end metal 434b, and the $M_{x+1}$ intermediate metal 434c while being separated from $M_{x+1}$ end metal 434a the second $M_{x+1}$ end metal 434b, and the $M_{x+1}$ intermediate metal 434c by the line barrier layer 460. The graphene lines 470a-470b may be made of substantially the same materials and formed by substantially the same methods as the graphene line 270.

After forming the graphene lines 470a-470b, an $M_{x+1}$ capping layer (not shown) and an $M_{x+2}$ dielectric layer (not shown) may be deposited above the $M_{x+1}$ dielectric layer 210 and the process described above in conjunction with FIGS. 4A-4F may be repeated to form an $M_{x+2}$ level containing an additional hybrid graphene metal line. Because both ends of the hybrid graphene metal line of the $M_{x+1}$ level 201 are metals (i.e., the first $M_{x+1}$ end metal 434a and the second $M_{x+1}$ end metal 434b), it may be possible to avoid making any electrical connections to the graphene lines 470a-470b. Instead, electrical connections from the $M_{x+2}$ level may be made to the first $M_{x+1}$ end metal 434a and the second $M_{x+1}$ end metal 434b.

Figure 4G:
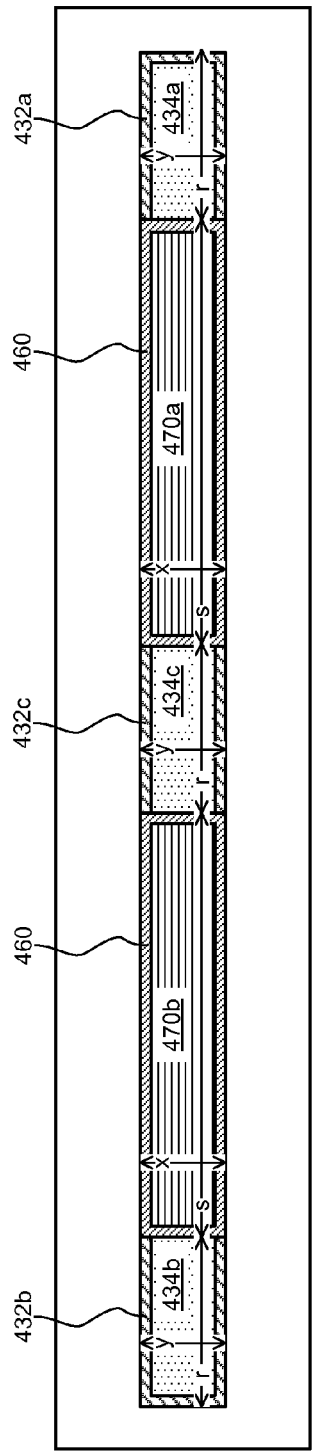
FIG. 4G is a top view depicting the formed hybrid graphene-metal line of FIG. 4F, according to an exemplary embodiment of the present invention.
Figure 4H:
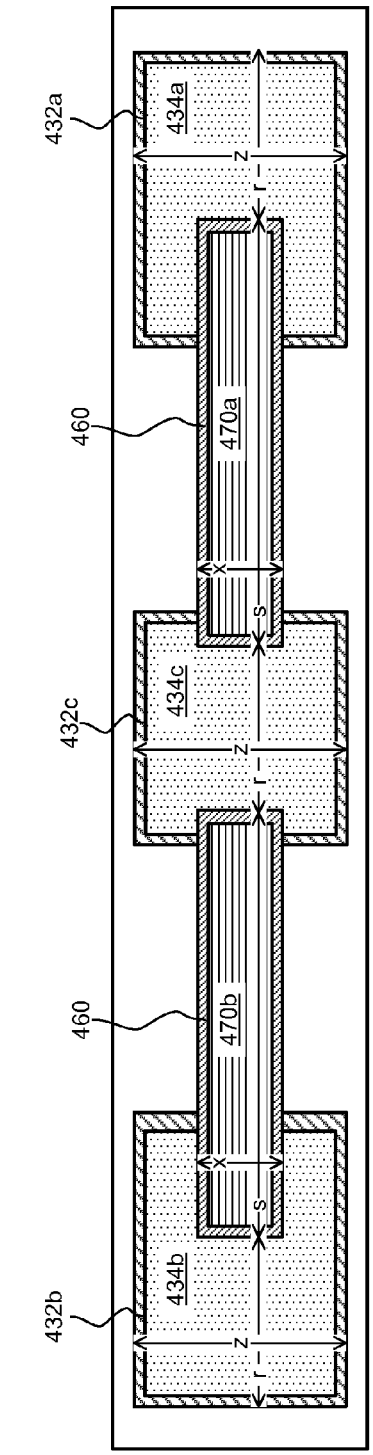
FIG. 4H is a top view depicting the formed hybrid graphene-metal line of FIG. 4F, according to an exemplary embodiment of the present invention.

FIGS. 4G-4H depict top views of FIG. 4F, according to several embodiments of the present invention. Referring to FIG. 4G, the first $M_{x+1}$ end metal 434a, the second $M_{x+1}$ end metal 434b, and the $M_{x+1}$ intermediate metal 434c may have the same width y as the first $M_{x+1}$ metal 234a and the second $M_{x+1}$ metal 234b, and the graphene lines 470a-470b may have the same width x as the graphene line 270, as depicted in FIG. 2H. Referring to FIG. 4H, the first $M_{x+1}$ end metal 434a, the second $M_{x+1}$ end metal 434b, and the $M_{x+1}$ intermediate metal 434c may have the same width z as the first $M_{x+1}$ metal 234a and the second $M_{x+1}$ metal 234b, and the graphene lines 470a-470b may have the same width x as the graphene line 270, as depicted in FIG. 2I.

With continued reference to FIGS. 4G-4H, the first $M_{x+1}$ end metal 434a, the second $M_{x+1}$ end metal 434b, and the $M_{x+1}$ intermediate metal 434c may have a length (r) and the graphene lines 470a-470b may have a length (s). In some embodiments, the lengths (r) and (s) may be optimized to improve the reliability of the interconnect structure 100. For example, one potential issue with metal lines in interconnect structure is electromigration, where the force generated by current flowing through a metal results in distortion of the metal. However, there is a critical length, or electromigration threshold length, below which the effects of electromigration may be negligible in a metal line. The electromigration threshold length may alternatively be referred to and known as a Blech Length. An interconnect or a metal line that has a length smaller than the electromigration threshold length or the Blech Length will not likely fail by electromigration. In such cases, a mechanical stress buildup causes an atom back flow process which reduces or even compensates the effective material flow towards the anode. By keeping the length (r) below this critical length, the impact of electromigration on the first $M_{x+1}$ end metal 434a, the second $M_{x+1}$ end metal 434b, and the $M_{x+1}$ intermediate metal 434c may be substantially reduced if not eliminated. Further, typical graphene deposition or growth processes may have an increased defect concentration as the length of the graphene layer increases. By controlling the length (s), it may be possible to maintain defect levels in the graphene lines 470a-470b below a desired concentration. In an exemplary embodiment, the length (r) may range from approximately 5 μm to approximately 20 μm and the length(s) may range from approximately 1 μm to approximately 10 μm, though greater and lesser lengths are explicitly contemplated.

Figure 5:
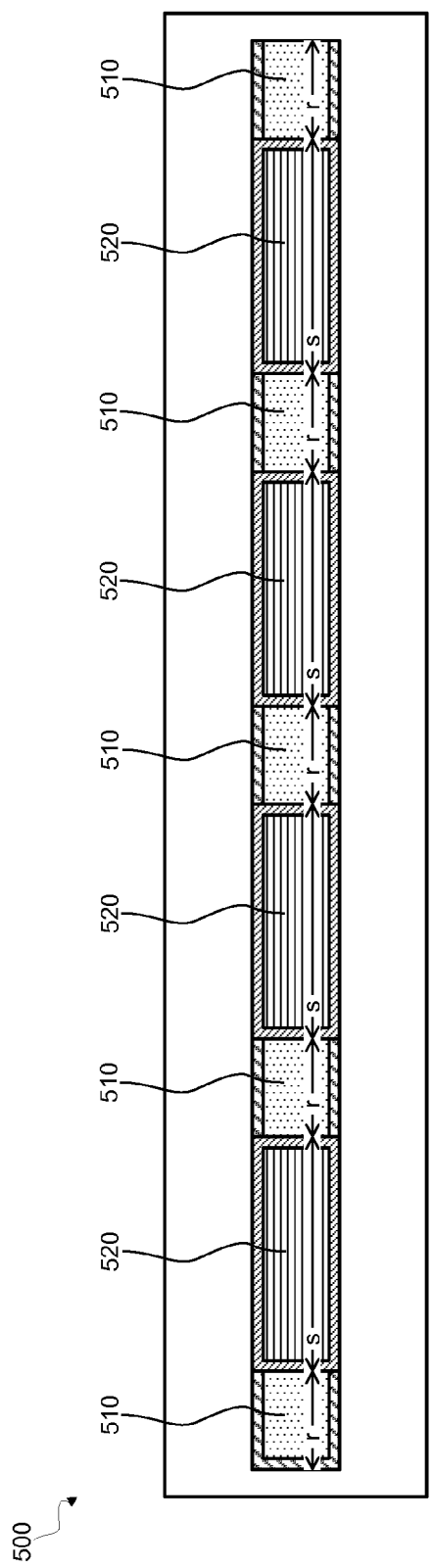
FIG. 5 is a top view depicting a hybrid graphene line including a plurality of metal portions and a plurality of graphene portions, according to an exemplary embodiment of the present invention.

Referring to FIG. 5, in further embodiments, a hybrid graphene-metal interconnect structure 500 may be formed including a plurality of metal portions 510 and a plurality of graphene portions 520 connecting the plurality of metal portions 510. The plurality of metal portions will include a first end metal substantially similar to the first $M_{x+1}$ end metal 434a (FIG. 4F), a second end metal substantially similar to the second $M_{x+1}$ end metal 434b (FIG. 4F), and one or more intermediate metals substantially similar to the $M_{x+1}$ intermediate metal 434c (FIG. 4F). Each of the plurality of graphene portions 520 will be substantially similar to the graphene lines 470a-470b. By increasing the number of intermediate metals in the plurality of metal portions and increasing the number of the plurality of graphene portions 520 while maintaining a length (r) for each of the plurality of metal portions 510 and a length (s) for each of the plurality of graphene portions 520, it may be possible to fabricate a hybrid graphene-metal line of any length while reducing the impact of electromigration in the metal portions and controlling the defect concentration in the plurality of graphene portions 520.

In an alternative embodiment, the advantages of the hybrid graphene metallization scheme described above may be exploited to produce an electronic fuse (e-fuse) having improved characteristics, for example, improved programming reliability, lower programming currents and shorter programming times.

The e-fuse is a structure that may be programmed in accordance with the application of a suitable electrical current. For example, an electrical current may be provided through the e-fuse to eventually cause the resistance of the e-fuse to exceed a predetermined threshold. A suitable electrical current depends on the e-fuse design and may range from about 10 mA to about 25 mA, and ranges there between. Alternatively, programming may occur at a threshold current density. For example, a typical current density of 1000 $MA/cm^2$ may be required to program the e-fuse. Additionally, a circuit is considered to be programmed, and open, when the e-fuse resistance increases more than an order of magnitude over the initial pre-programmed resistance of the e-fuse.

During programming of the e-fuse, one or more voids may form in unexpected locations due to non-optimized processing. Location of the voids may be uncontrollable and may affect the yield and reliability of the e-fuse. The voids may be due in part to the electromigration of conductive interconnect material within the e-fuse.

The basic principle of the alternative embodiment includes methods of making a hybrid e-fuse structure. The methods result in structures which include a hybrid metallization scheme. Ideally only the targeted e-fuse will be programmed while maintaining the integrity of all surrounding circuits. One embodiment by which to fabricate an e-fuse having hybrid metallization, is described in detail below by referring to the accompanying drawings FIGS. 6 and 7. In the present embodiment, a vertical e-fuse may be fabricated in two successive metallization levels, and may include hybrid metallization in direct contact with a via.

Figure 6:
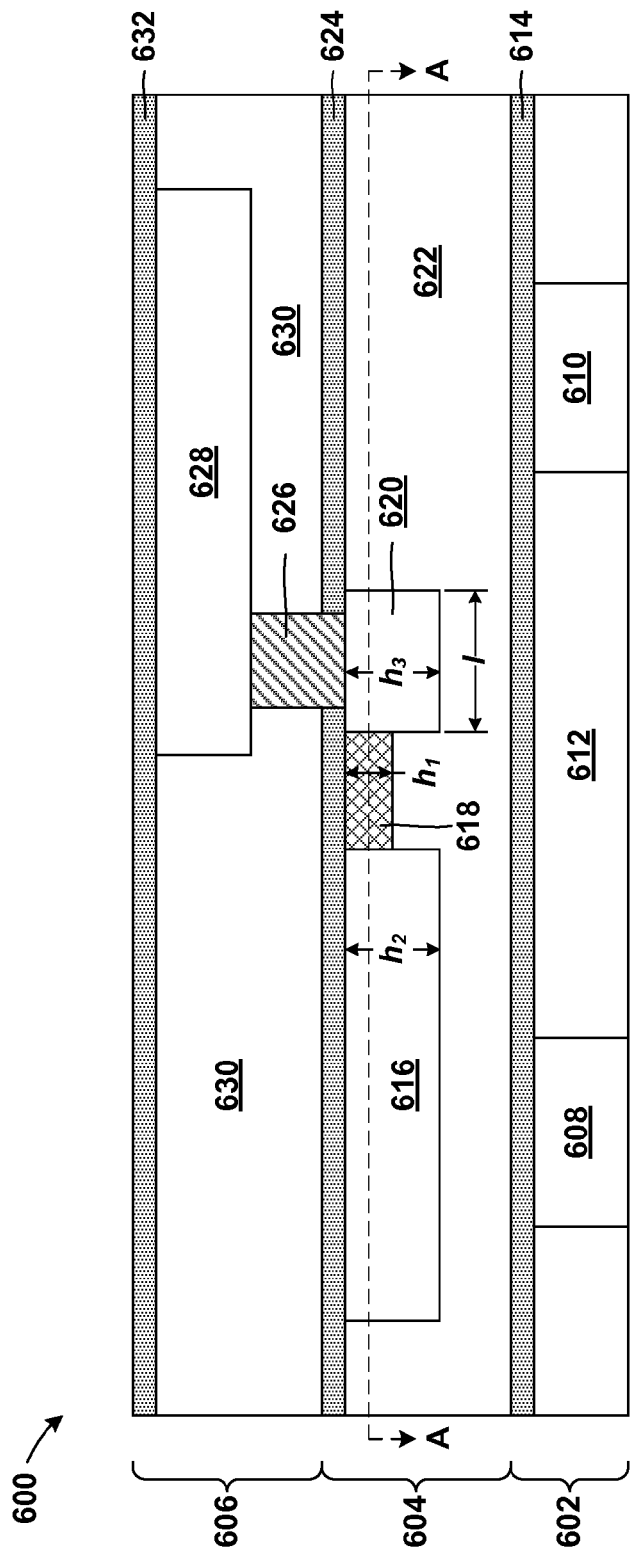
FIG. 6 is a cross-sectional view depicting an electronic fuse structure according to an exemplary embodiment of the present invention.
Figure 7:
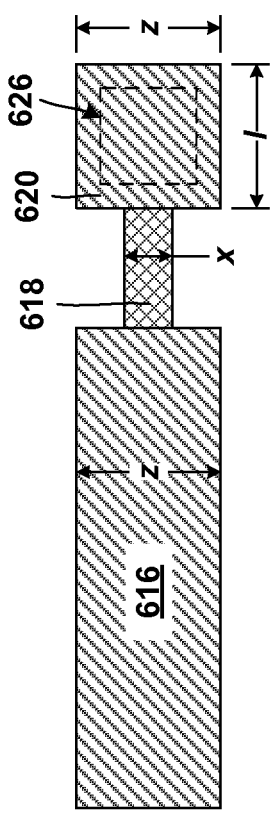
FIG. 7 is a cross-sectional view of FIG. 6 along section line A-A.

Referring now to FIGS. 6 and 7, a structure 600 is shown. FIG. 7 is a cross section view, section A-A, of FIG. 6. The structure 600 may include an $M_x$ level 602, an $M_{x+1}$ level 604, and an $M_{x+2}$ level 606. The $M_x$ level 602 may include a first $M_x$ metal 608, a second $M_x$ metal 610, an $M_x$ dielectric layer 612, and an $M_x$ cap 614. The $M_x$ level 602 may represent any interconnect level in the structure 600. In an embodiment, the $M_x$ level 602 may represent a metallization level directly above a contact level or an active device level. The $M_{x+1}$ level 604 may include a first $M_{x+1}$ metal 616, a second $M_{x+1}$ metal 618, a third $M_{x+1}$ metal 620, an $M_{x+1}$ dielectric layer 622, and an $M_{x+1}$ cap 624. The $M_{x+2}$ level 606 may include an $M_{x+2}$ via 626, an $M_{x+2}$ metal 628, an $M_{x+2}$ dielectric layer 630, and an $M_{x+2}$ cap 632. It should be noted that while only three interconnect levels are shown, in some embodiments the structure 600 may have multiple interconnect levels either above, below, or above and below the $M_x$ level 602 and the $M_{x+2}$ level 606.

The $M_x$ dielectric layer 612 may be substantially similar to the $M_x$ dielectric 110 described above. In an embodiment, the $M_x$ dielectric layer 612 may include any suitable dielectric material, for example, silicon oxide ($SiO_2$), silicon nitride ($Si_3N_4$), hydrogenated silicon carbon oxide (SiCOH), silicon based low k dielectrics, or porous dielectrics. Known suitable deposition techniques, such as, for example, chemical vapor deposition, plasma enhanced chemical vapor deposition, atomic layer deposition, or physical vapor deposition may be used to form the $M_x$ dielectric layer 612. The $M_x$ dielectric layer 612 may have a typical thickness ranging from about 100 nm to about 450 nm and ranges there between, although a thickness less than 100 nm and greater than 450 nm may be acceptable.

The first and second $M_x$ metals 608, 610 may be substantially similar to the first and second $M_x$ metals 120a, 120b described above with reference to FIG. 2A. In general, the first and second $M_x$ metals 608, 610 may be formed using any known technique, and may include any suitable conductive interconnect material, for example, copper, aluminum or tungsten. Both the first and second $M_x$ metals 608, 610 may include a typical line or wire found in a typical semiconductor circuit. The first and second $M_x$ metals 608, 610 may be substantially similar structures and may be fabricated using, for example, a typical single damascene technique in which a conductive interconnect material may be deposited in a trench formed in the $M_x$ dielectric layer 612.

In an embodiment, the first and second $M_x$ metals 608, 610 may include various barrier liners (not shown). One barrier liner may include, for example, tantalum nitride (TaN), followed by an additional layer including tantalum (Ta). One barrier liner may include, for example, titanium (Ti), followed by an additional layer including titanium nitride (TiN). Other barrier liners may include cobalt (Co) or ruthenium (Ru) either alone or in combination with any other suitable liner. The conductive interconnect material may include, for example, copper (Cu), aluminum (Al), or tungsten (W). The conductive interconnect material may be formed using a filling technique such as electroplating, electroless plating, chemical vapor deposition, physical vapor deposition or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using any suitable deposition technique, for example chemical vapor deposition or physical vapor deposition, prior to filling the trench. The seed layer may also include similar dopants as the conductive interconnect material.

With continued reference to FIG. 6, the $M_x$ cap 614 may be deposited over the structure 600. The $M_x$ cap 614 may electrically insulate the $M_x$ level 602 from additional interconnect levels that may be subsequently formed above the $M_x$ level 602, for example the $M_{x+1}$ level 604. The $M_x$ cap 614 may be used to improve interconnect reliability and prevent copper from diffusing into an $M_{x+1}$ dielectric that may be subsequently formed above. The $M_x$ cap 614 may be deposited using typical deposition techniques, for example, chemical vapor deposition. The $M_x$ cap 614 may include any suitable dielectric material, for example, silicon nitride ($Si_3N_4$), silicon carbide (SiC), silicon carbon nitride (SiCN), hydrogenated silicon carbide (SiCH), or other known capping materials. The $M_x$ cap 614 may have a thickness ranging from about 15 nm to about 55 nm and ranges there between, although a thickness less than 15 nm and greater than 55 nm may be acceptable.

Next, the $M_{x+1}$ level 604 may be formed above the $M_x$ level 602. First, the $M_{x+1}$ dielectric 622 may be deposited. The $M_{x+1}$ dielectric 622 may be substantially similar in all respects to the $M_x$ dielectric layer 612 described above. The first $M_{x+1}$ metal 616, the second $M_{x+1}$ metal 618, the third $M_{x+1}$ metal 620, the $M_{x+1}$ dielectric layer 622, and the $M_{x+1}$ cap 624 may be formed in accordance with the techniques described above. More specifically, the first $M_{x+1}$ metal 616 and the third $M_{x+1}$ metal 620 may be substantially similar to the first and second $M_x$ metals 608, 610 described above. In an embodiment, the first $M_{x+1}$ metal 616 and the third $M_{x+1}$ metal 620 may be made of copper fabricated using a single damascene technique. In addition, the second $M_{x+1}$ metal 618 may be substantially similar, in all respects, to the graphene line 270 described above with reference to FIGS. 2G, 2H, and 2I.

In the present case, the second $M_{x+1}$ metal 618 may be fabricated such that is abuts and is in electrical contact with each of the first $M_{x+1}$ metal 616 and the third $M_{x+1}$ metal 620. Also, in general, the second $M_{x+1}$ metal 618 may have cross sectional dimensions smaller than either of the first $M_{x+1}$ metal 616 or the third $M_{x+1}$ metal 620. More specifically, the second $M_{x+1}$ metal 618 may have a height ($h_1$) approximately 50% less than either a height ($h_2$) of the first $M_{x+1}$ metal 616 or a height ($h_3$) of the third $M_{x+1}$ metal 620. Finally, like the $M_x$ cap 614, the $M_{x+1}$ cap 624 may be deposited above the structure 600. The $M_{x+1}$ cap 624 may be substantially similar, in all respects, to the $M_x$ cap 614 described above.

Next, the $M_{x+2}$ level 606 may be formed above the $M_{x+1}$ level 604. First, the $M_{x+2}$ dielectric layer 630 may be deposited. The $M_{x+2}$ dielectric layer 630 may be substantially similar in all respects to the $M_x$ dielectric layer 612 described above. The $M_{x+2}$ via 626, the $M_{x+2}$ metal 628, the $M_{x+2}$ dielectric layer 630, and the $M_{x+2}$ cap 632 may be formed in accordance with the techniques described above. More specifically, the $M_{x+2}$ metal 628 may be substantially similar to the first and second $M_x$ metals 608, 610 described above. In an embodiment, the $M_{x+2}$ metal 628 may be made of copper fabricated using a single damascene technique. In addition, the $M_{x+2}$ via 626 may be formed using a single or dual damascene technique, as describe above with reference to the first and second $M_x$ metals 608, 610. In some cases, both the $M_{x+2}$ metal 628 and the $M_{x+2}$ via 626 may be formed simultaneously using a dual damascene techniques as is well known in the art.

Vias, generally, may be used to form electrical connections between the metallization of two interconnect levels. The $M_{x+2}$ via 626 may extend vertically from the third $M_x$ metal 620 up to the $M_{x+2}$ metal 628. Generally, the $M_{x+2}$ via 626 may have a diameter or width of a typical via opening formed in the BEOL. In one embodiment, the $M_{x+2}$ via 626 may have an aspect ratio of about 4:1 or more, and a diameter or width ranging from about 10 nm to about 100 nm and ranges there between, although a via diameter less than 10 nm and greater than 100 nm may be acceptable. Most typically, the $M_{x+2}$ via 626 may have a diameter or width less than a width (z) of either the second $M_{x+1}$ metal 620 or the third $M_{x+1}$ metal 620. Finally, like the $M_x$ cap 614, the $M_{x+2}$ cap 632 may be deposited above the structure 600.

The $M_{x+2}$ cap 632 may be substantially similar, in all respects, to the $M_x$ cap 614 described above.

In the present embodiment, it should be noted that the hybrid metallization, and more specifically the second $M_{x+1}$ metal 618 and the third $M_{x+1}$ metal 620, may be fabricated in close proximity to the $M_{x+2}$ via 626 such that the dimensions of the third $M_{x+1}$ metal 620 remain small enough to substantially reduce or eliminate electromigration effects. If the length of a metal line is less than the "Blech" length, copper ion motion will not occur, shutting down the electromigration process. Mechanical stress at lengths less than the "Blech" length opposes the drift of copper ions. A typical Blech length may be about 10 microns for typical interconnect structures consisting of copper. Therefore, a length (l) of the third $M_{x+1}$ metal 620 may preferably be less than the Blech length in order to substantially reduce or eliminate electromigration effects.

With continued reference to FIGS. 6 and 7, a final e-fuse structure is shown according to one embodiment. The first $M_{x+1}$ metal 616, the second $M_{x+1}$ metal 618, the third $M_{x+1}$ metal 620, and the $M_{x+2}$ via 626 may together form the final e-fuse structure. In the present embodiment the $M_{x+1}$ via 626 may function as the fuse link and function as a point of failure according to known electromigration failure mechanisms in which the conductive material of the $M_{x+1}$ via 626 migrates in the path of the flow of electrons and produces a void. More specifically, a void may form at or near a bottom of the $M_{x+1}$ via 626 as a result of increased current density and heating in the via. Assuming electrons flow from the first $M_{x+1}$ metal 616 to the $M_{x+2}$ metal 628, the addition of the second $M_{x+1}$ metal 618 between the first $M_{x+1}$ metal 616 and the third $M_{x+1}$ metal 620 improves the electromigration resistance of the third $M_{x+1}$ metal 620, as described above. Also, assuming a similar current path, the void may typically form at or near a bottom of the $M_{x+1}$ via 626. In general, it should be noted that the electromigration resistance of the $M_{x+2}$ via 626 remains unchanged and may be unaffected by the existence or placement of the second $M_{x+1}$ metal 618.

Increased electromigration resistance of the third $M_{x+1}$ metal 620 may help prevent the migration of the conductive interconnect material from the third $M_{x+1}$ metal 620 to the $M_{x+2}$ via 626. This in turn may encourage or enhance the formation of a void to form at or near a bottom of the $M_{x+2}$ via 626 according to know electromigration failure principles.

Stated differently, the existence and placement of the second $M_{x+1}$ metal 618 may be designed to improve the electromigration resistance of the third $M_{x+2}$ metal 620 by limiting its size or length (l). By doing so, the conductive material of the third $M_{x+1}$ metal 620 may not migrate into the $M_{x+2}$ via 626 and may not backfill any void which may be formed in the $M_{x+2}$ via 626 due to the effects of electromigration. Therefore, a void may be allowed to form in the $M_{x+2}$ via 626 and increase the resistance of the e-fuse circuit above some predetermined level to be considered programed as briefly mentioned above.

The advantages of the hybrid graphene metallization scheme described above may be exploited to produce an electronic fuse (e-fuse) having improved characteristics according to another embodiment. Another embodiment by which to fabricate an e-fuse having hybrid metallization, is described in detail below by referring to the accompanying drawings FIGS. 8 and 9. In the present embodiment, a horizontal e-fuse may be fabricated in a single metallization level including a hybrid metallization scheme.

Figure 8:
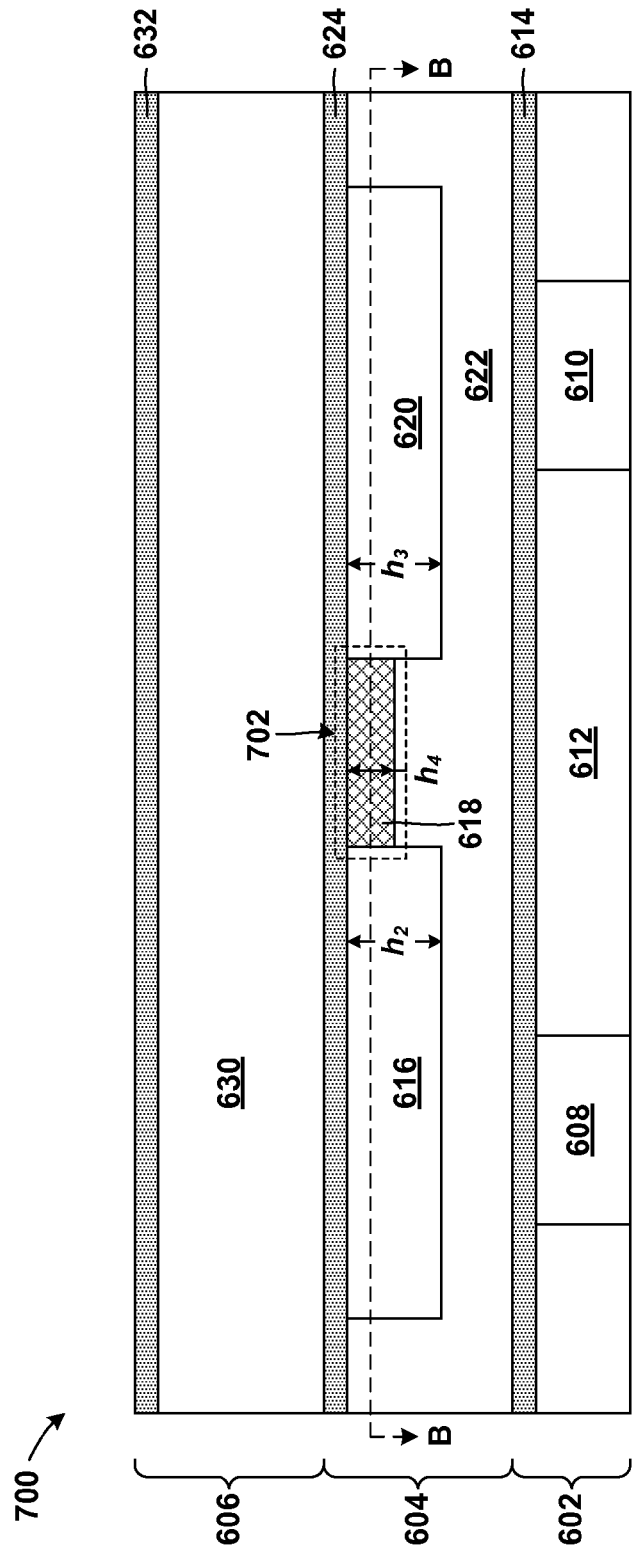
FIG. 8 is a cross-sectional view depicting an electronic fuse structure according to an exemplary embodiment of the present invention.
Figure 9:
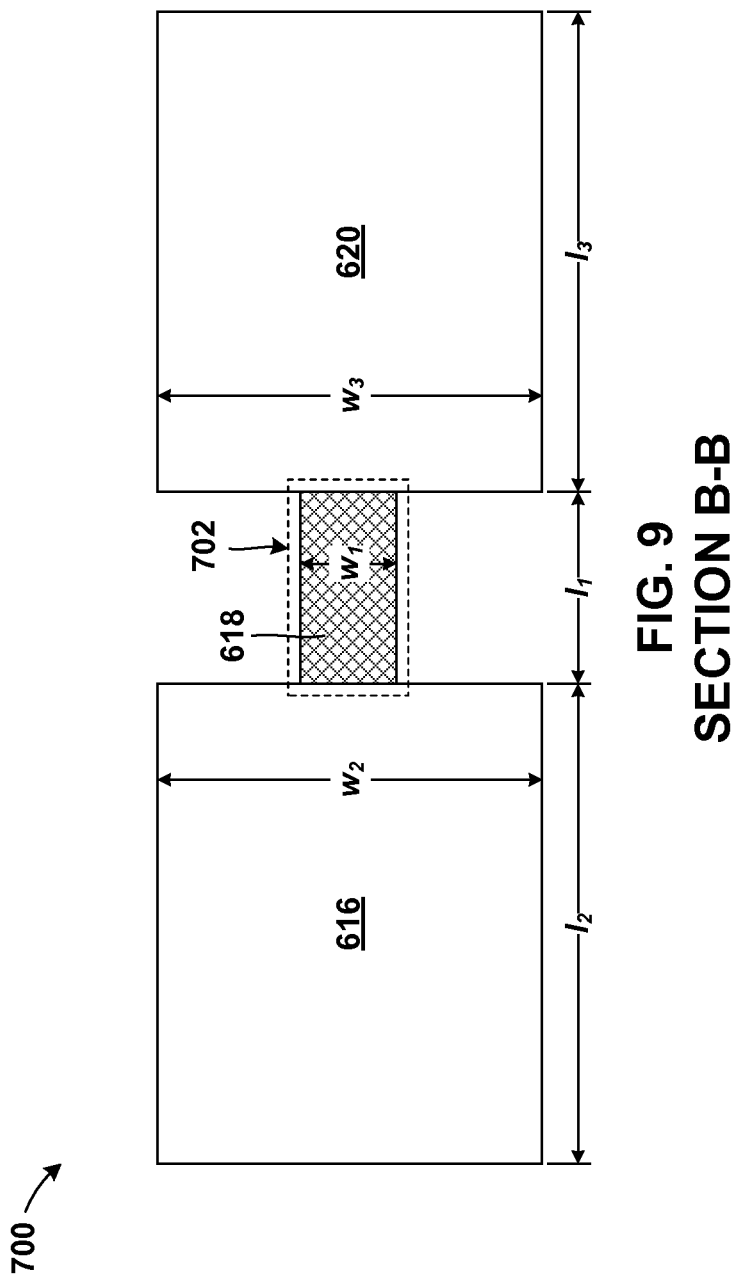
FIG. 9 is a cross-sectional view of FIG. 8 along section line B-B.

Referring now to FIGS. 8 and 9, a structure 700 is shown. FIG. 9 is a cross section view, section B-B, of FIG. 8. The structure 700 may include the Mx level 602, the $M_{x+1}$ level 604, and the $M_{x+2}$ level 606. In the present embodiment, the $M_x$ level 602 may include the first $M_x$ metal 608, the second $M_x$ metal 610, the $M_x$ dielectric layer 612, and the $M_x$ cap 614. Like above, the $M_x$ level 602 may represent any interconnect level in the structure 700. The $M_{x+1}$ level 604 may include the first $M_{x+1}$ metal 616, a fuse link 702, the third $M_{x+1}$ metal 620, the $M_{x+1}$ dielectric layer 622, and the $M_{x+1}$ cap 624. The $M_{x+2}$ level 606, although not illustrated, may include any assortment of interconnect features, similar but not limited to those described above. The fuse link 702 of the present embodiment may be substantially similar, in all respects, to the graphene line 270 described above with reference to FIGS. 2G, 2H, and 2I.

With continued reference to FIGS. 8 and 9, the fuse link 702 may generally have cross sectional dimensions smaller than either of the first $M_{x+1}$ metal 616 or the third $M_{x+1}$ metal 620. The fuse link 702 may be designed with smaller cross sectional dimensions than either of the first $M_{x+1}$ metal 616 or the third $M_{x+1}$ metal 620 to intentionally increase the current density within the fuse link 702. The intentional increase in the current density within the fuse link 702 may be designed such that it causes failure within the fuse link 702. In one embodiment, the fuse link 702 may have a height ($h_4$) approximately 25% or less than either a height ($h_2$) of the first $M_{x+1}$ metal 616 or a height ($h_3$) of the third $M_{x+1}$ metal 620. For example, in an embodiment, the height ($h_2$) of the first $M_{x+1}$ metal 616 and the height ($h_3$) of the third $M_{x+1}$ metal 620 may range from approximately 50 nm to approximately 160 nm, and the height ($h_4$) of the fuse link 702 may range from approximately 2 nm to approximately 5 nm. However, greater or lesser heights are explicitly contemplated.

In one embodiment, the fuse link 702 may have a width ($w_1$) approximately 50% or less than either a width ($w_2$) of the first $M_{x+1}$ metal 616 or a width ($w_3$) of the third $M_{x+1}$ metal 620. For example, in an embodiment, the width ($w_2$) of the first $M_{x+1}$ metal 616 and the width ($w_3$) of the third $M_{x+1}$ metal 620 may range from approximately 10 nm to approximately 80 nm, and the width ($w_1$) of the fuse link 702 may range from approximately 5 nm to approximately 40 nm. However, greater or lesser widths are explicitly contemplated.

In one embodiment, the fuse link 702 may have a length ($l_1$) smaller than either a length ($l_2$) of the first $M_{x+1}$ metal 616 or a length ($l_3$) of the third $M_{x+1}$ metal 620. For example, in an embodiment, the length ($l_2$) of the first $M_{x+1}$ metal 616 and the length ($l_3$) of the third $M_{x+1}$ metal 620 may range from approximately 2 μm to approximately 20 μm, and the length ($l_1$) of the fuse link 702 may range from approximately 1 μm to approximately 10 μm. In all cases the fuse link 702 may be less than 10 nm in order to control its temperature and failure.

As mentioned above, the current density within the fuse link 702 may be substantially increased due to its reduced dimensions relative to the adjoining metals. For example, the first and second $M_{x+1}$ metal 616, 620 may typically have a current density of approximately 300 MA/cm$^2$, and a graphene fuse link 702 may typically have a current density of approximately 12,500 MA/cm$^2$. In the present embodiment, the fuse link 702 may have a higher or substantially higher resistance as compared to the first and second $M_{x+1}$ metal 618, 620. For example, a graphene fuse link 702 may have a resistivity of approximately $10^{-6}$ Ohm cm, which may be approximately 2 times lower than the resistivity of either the first or second $M_{x+1}$ metal 618, 620. Because of its reduced dimensions and its increased resistance, the fuse link 702 may generate a substantial amount of heat when exposed to a typical programming current. Stated differently, when a typical programming current is applied across the fuse link 702, a temperature of the fuse link 702 may be approximately 1000° C. or greater.

Finally, like the Mx cap 614, the $M_{x+1}$ cap 624 may be deposited above the structure 600. The $M_{x+1}$ cap 624 may be substantially similar, in all respects, to the $M_x$ cap 614 described above.

Figure 10:
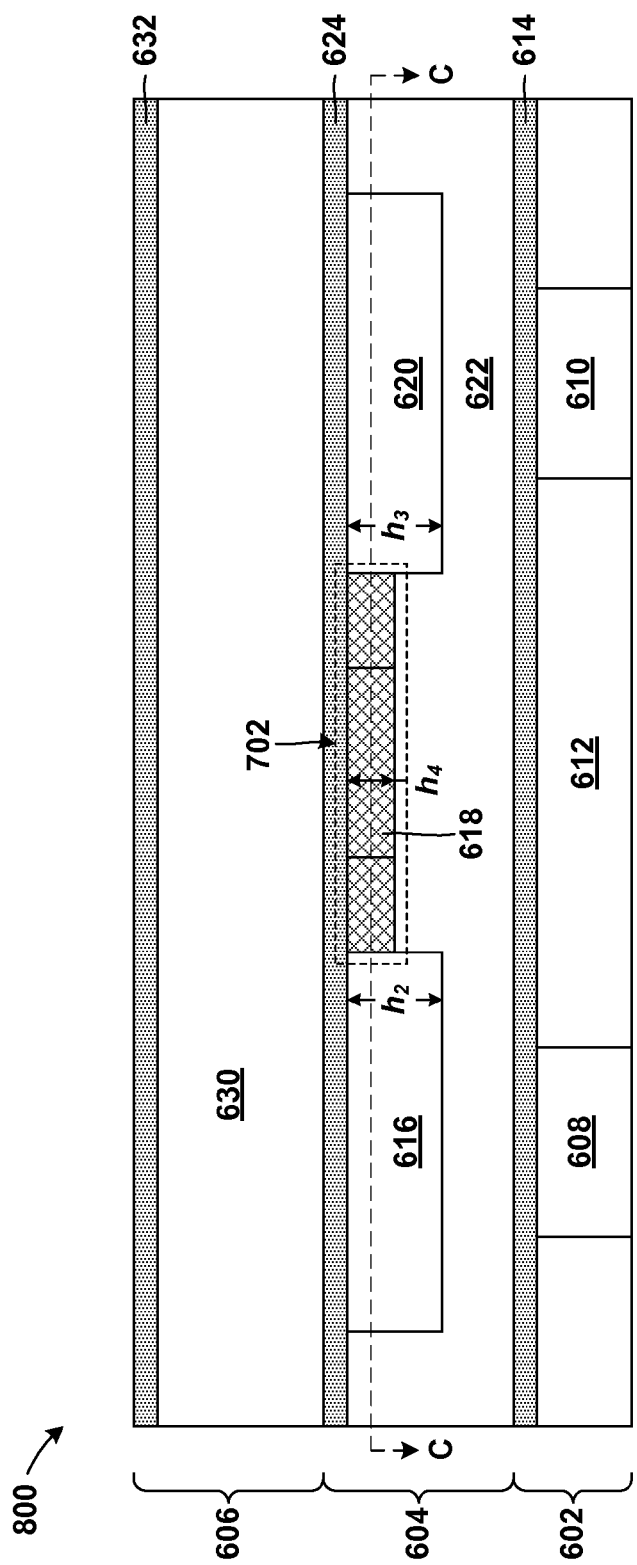
FIG. 10 is a cross-sectional view depicting an electronic fuse structure according to an exemplary embodiment of the present invention.
Figure 11:
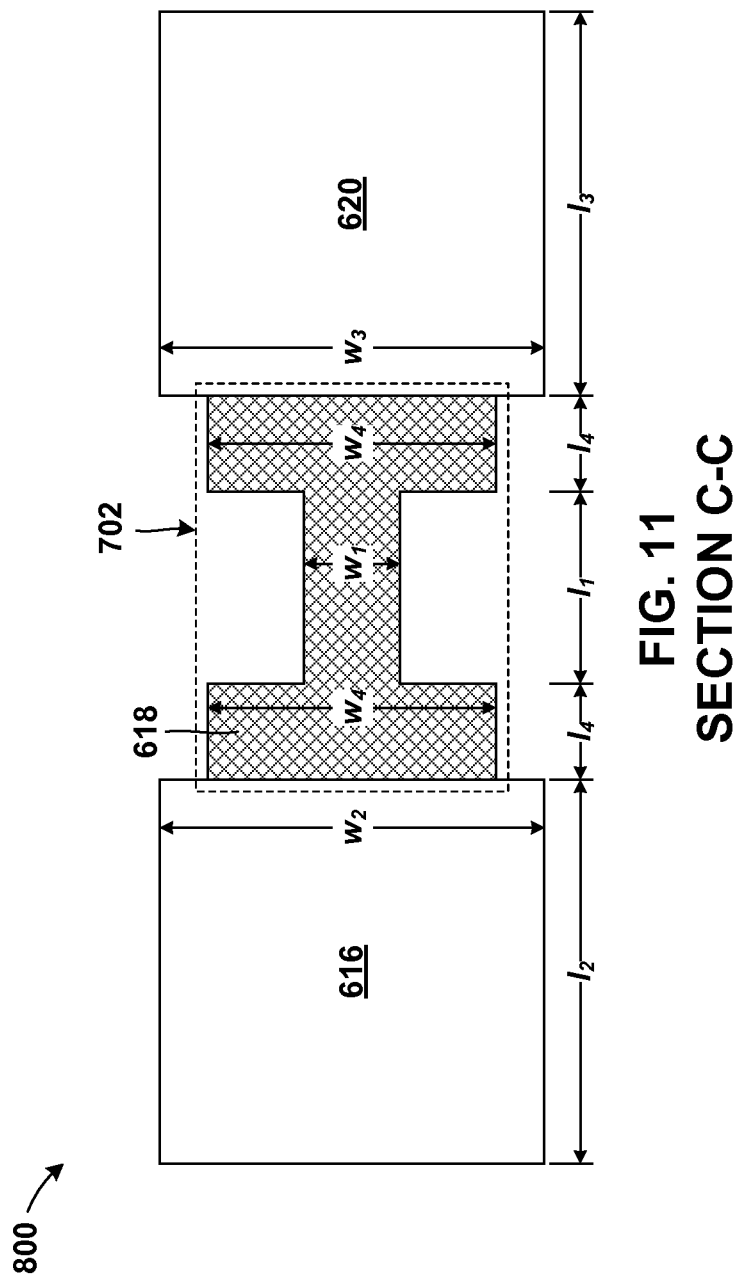
FIG. 11 is a cross-sectional view of FIG. 10 along section line C-C.

Referring now to FIGS. 10 and 11, a structure 800 is shown. FIG. 11 is a cross section view, section C-C, of FIG. 10. The structure 800 may be substantially similar to the structure 700 depicted in FIGS. 8 and 9; however the fuse link 702 may have an alternative shape. More specifically, as illustrated, the fuse link 702 may have shape similar to that of a bone or the letter "H," where a center portion is smaller than either end portion. In the present example, the wider end portions of the fuse link 702 may be in direct contact with the first $M_{x+1}$ metal 616 and the third $M_{x+1}$ metal 620. Stated differently, the narrow center portion of the fuse link 702 may be separated from either of the first $M_{x+1}$ metal 616 or the third $M_{x+1}$ metal 620 by a wider end portion of the fuse link 702. The narrow center portion of the fuse link 702 may have a width ($w_1$) similar to that described above. Either end portion of the fuse link 702 may have a width ($w_4$) larger than the width ($w_1$) of the center portion of the fuse link 702, but smaller than a width ($w_2$, $w_3$) of either the first $M_{x+1}$ metal 616 or the third $M_{x+1}$ metal 620. In an embodiment, the widths ($w_4$) of the end portions of the fuse link 702 need not be the same. Either end portion of the fuse link 702 may have a length ($l_4$) smaller than the length ($l_1$) of the center portion of the fuse link 702, and smaller than a length ($l_2$, $l_3$) of either the first $M_{x+1}$ metal 616 or the third $M_{x+1}$ metal 620.

Figure 12:
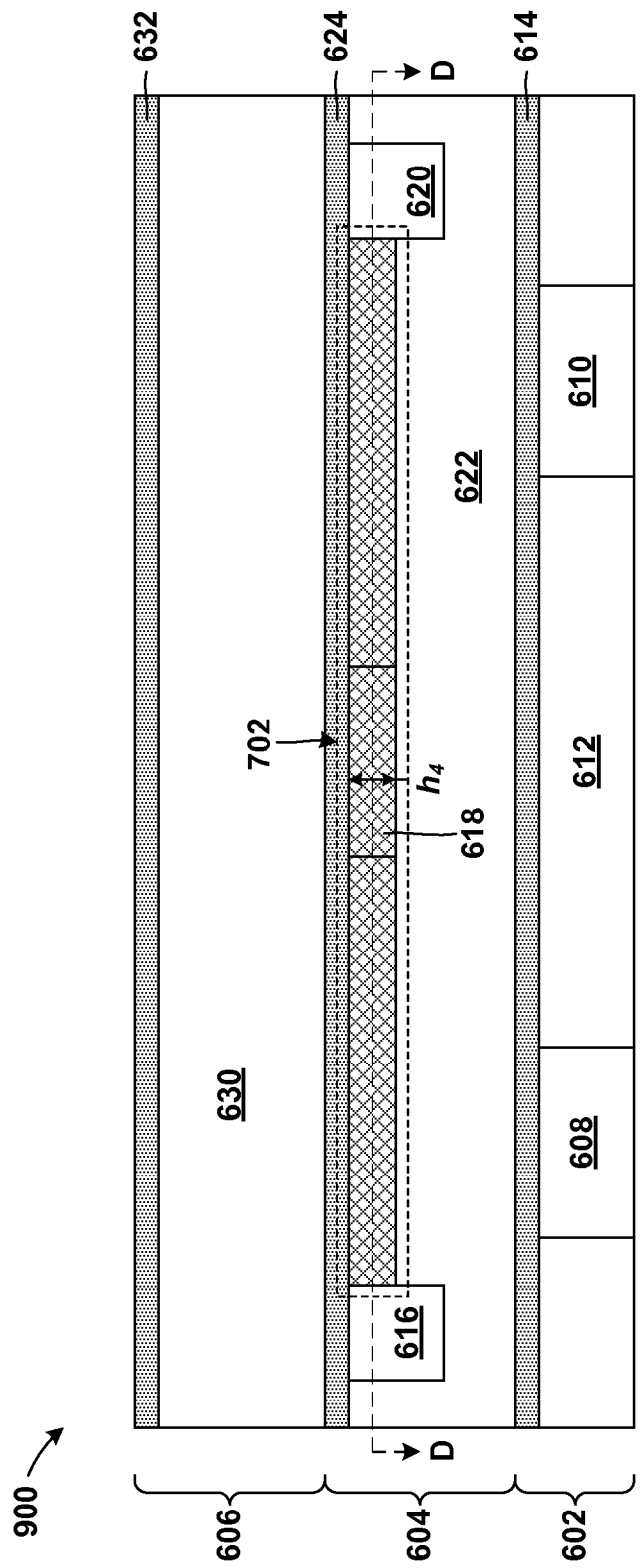
FIG. 12 is a cross-sectional view depicting an electronic fuse structure according to an exemplary embodiment of the present invention.
Figure 13:
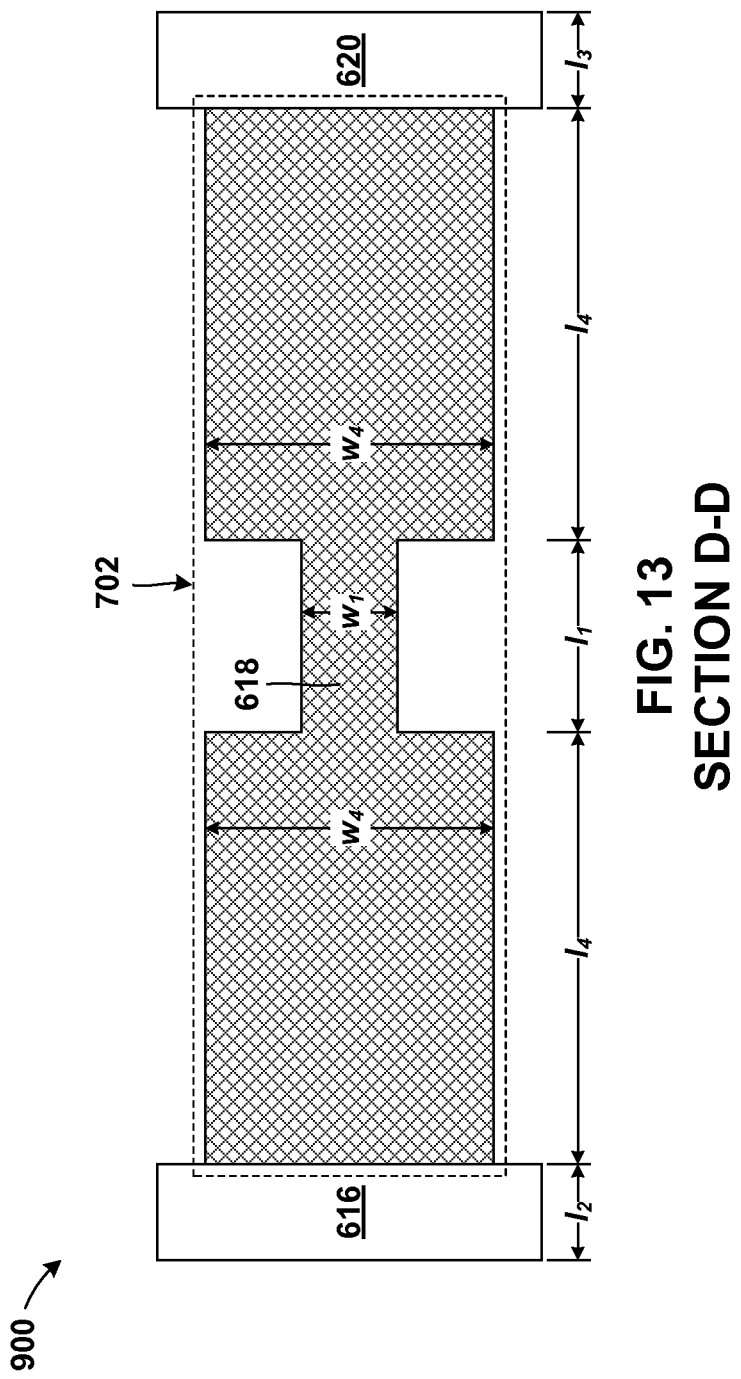
FIG. 13 is a cross-sectional view of FIG. 6 along section line D-D.

Referring now to FIGS. 12 and 13, a structure 900 is shown. FIG. 13 is a cross section view, section D-D, of FIG. 12. The structure 900 may be substantially similar to the structure 900 depicted in FIGS. 10 and 11; however the fuse link 702 may have a similar shape with different proportions and dimensions. In the present embodiment, either end portion of the fuse link 702 may have a length ($l_4$) larger than the length ($l_1$) of the center portion of the fuse link 702, but larger than a length ($l_2$, $l_3$) of either the first $M_{x+1}$ metal 616 or the third $M_{x+1}$ metal 620.

The embodiments disclosed herein have the capability to improve the failure mechanism of the e-fuse structure by lowering the programming current and reducing the programming times. In turn, effectively improving the reliability and efficiency of the e-fuse structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein. It is therefore intended that the present invention not be limited to the exact forms and details described and illustrated but fall within the scope of the appended claims.

What is claimed is:

1. A method comprising:
    forming an $M_x$ level comprising a first $M_x$ metal, a second $M_x$ metal, and a third $M_x$ metal abutting and electrically connected in sequence with one another, such that the third $M_x$ metal abuts and is positioned between the first and second $M_x$ metals, wherein the second and third $M_x$ metals comprise graphene; and
    forming an $M_{x+1}$ level above the $M_x$ level, the $M_{x+1}$ level comprising an $M_{x+1}$ metal and an $M_{x+1}$ via, the $M_{x+1}$ via electrically connecting the second $M_x$ metal to the $M_{x+1}$ metal in a vertical orientation, wherein the $M_{x+1}$ via is adjacent to the third $M_x$ metal and directly contacts the second $M_x$ metal.

2. The method of claim 1, wherein the third $M_x$ metal comprises a length less than or equal to a critical length below which the third $M_x$ metal will not fail by electromigration.

3. The method of claim 1, wherein the third $M_x$ metal comprises a length less than or equal to an electromigration threshold length, below which any electromigration effect is negligible.

4. The method of claim 1, wherein the third $M_x$ metal comprises a length less than or equal to a blech length.

5. The method of claim 1, wherein a height of the second $M_x$ metal is less than a height of either the first $M_x$ metal or the third $M_x$ metal.

6. The structure of claim 1, wherein a width of the second $M_x$ metal is approximately equal to a width of either the first $M_x$ metal or the third $M_x$ metal.

7. The method of claim 1, wherein a width of either the second $M_x$ metal or the third $M_x$ metal is approximately one to three times a width of the second $M_x$ metal.

8. A method comprising:
    etching, in an $M_x$ dielectric layer, a first trench and a second trench;
    filling the first trench and the second trench with a metal to form a first $M_x$ metal, and a second $M_x$ metal;
    forming a third trench abutting and in between the first $M_x$ metal and the second $M_x$ metal;
    filling the third trench with graphene to form a third $M_x$ metal, the graphene of the third $M_x$ metal is in direct contact with the metal of both the first $M_x$ metal and the second $M_x$ metal;
    etching, in an $M_{x+1}$ dielectric layer, a dual damascene opening comprising a via opening and a trench, the via opening being directly above and exposing an upper surface of the second $M_x$ metal; and
    filling the via opening and the trench with the metal to form an $M_{x+1}$ via and an $M_{x+1}$ metal, the $M_{x+1}$ via being adjacent to the third $M_x$ metal and in direct contact with the second $M_x$ metal in the $M_x$ dielectric layer.

9. The method of claim 8, wherein the second $M_x$ metal comprises a length less than or equal to a critical length below which the second $M_x$ metal will not fail by electromigration.

10. The method of claim 8, wherein the second $M_x$ metal comprises a length less than or equal to an electromigration threshold length, below which any electromigration effect is negligible.

11. The method of claim 8, wherein the second $M_x$ metal comprises a length less than or equal to a blech length.

12. The method of claim 8, wherein a height of the second $M_x$ metal is less than a height of either the first $M_x$ metal or the third $M_x$ metal.

13. The method of claim 8, wherein a width of either the first $M_x$ metal or the second $M_x$ metal is approximately one to three times a width of the third $M_x$ metal.

* * * * *